United States Patent
Naeli et al.

(10) Patent No.: US 10,100,822 B2
(45) Date of Patent: Oct. 16, 2018

(54) PUMP HAVING FREELY MOVABLE MEMBER

(71) Applicant: Hewlett-Packard Development Company, Houston, TX (US)

(72) Inventors: Kianoush Naeli, Corvallis, OR (US); David A. Moore, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/546,992

(22) PCT Filed: Apr. 20, 2015

(86) PCT No.: PCT/US2015/026716
§ 371 (c)(1),
(2) Date: Jul. 27, 2017

(87) PCT Pub. No.: WO2016/171660
PCT Pub. Date: Oct. 27, 2016

(65) Prior Publication Data
US 2018/0030977 A1 Feb. 1, 2018

(51) Int. Cl.
*F04B 43/04* (2006.01)
*F04B 53/10* (2006.01)
*B41J 2/175* (2006.01)
*H05K 7/20* (2006.01)
*G06F 1/20* (2006.01)

(52) U.S. Cl.
CPC ......... *F04B 43/043* (2013.01); *B41J 2/17596* (2013.01); *F04B 53/10* (2013.01); *G06F 1/203* (2013.01); *H05K 7/20272* (2013.01); *G06F 1/20* (2013.01); *G06F 2200/201* (2013.01)

(58) Field of Classification Search
CPC ..... B41J 2/17596; F04B 43/043; F04B 53/10; G06F 1/203; G06F 2200/201; H05K 7/20272
See application file for complete search history.

(56) References Cited

U.S. PATENT DOCUMENTS 4,636,149 A 1/1987 Brown
5,129,794 A 7/1992 Beatty
(Continued)

FOREIGN PATENT DOCUMENTS

JP 2007092677 4/2007

OTHER PUBLICATIONS

Lasance; "Advances in High-performance Cooling for Electronics; Electronics Cooling Magazine"; Nov. 1, 2005.
(Continued)

*Primary Examiner* — Anh T. N. Vo
(74) *Attorney, Agent, or Firm* — HP Inc. Patent Department

(57) ABSTRACT

A pump includes a main chamber and a pair of valves on opposite ends of the main chamber. The respective valves each contain a freely movable member to selectively open and close each respective valve, wherein the freely movable member is formed from at least some of the same material used to form a chamber portion of the respective valves. A force applicator is coupled relative to the main chamber to alternately induce a suction action and an expulsion action.

15 Claims, 18 Drawing Sheets

(56) References Cited

U.S. PATENT DOCUMENTS

| | | | |
|---|---|---|---|
| 6,042,345 A * | 3/2000 | Bishop | F04B 17/003 417/322 |
| 6,052,284 A | 4/2000 | Suga et al. | |
| 6,390,791 B1 | 5/2002 | Maillefer et al. | |
| 6,501,654 B2 | 12/2002 | O'Connor et al. | |
| 6,611,425 B2 | 8/2003 | Ohashi et al. | |
| 6,739,576 B2 | 5/2004 | O'Connor et al. | |
| 6,827,559 B2 | 12/2004 | Peters et al. | |
| 6,869,275 B2 * | 3/2005 | Dante | F04B 43/046 251/129.06 |
| 7,134,289 B2 | 11/2006 | Patel et al. | |
| 7,240,500 B2 | 7/2007 | Bash | |
| 7,284,389 B2 | 10/2007 | Sharma et al. | |
| 7,290,554 B2 | 11/2007 | Koeneman | |
| 7,311,503 B2 | 12/2007 | Van Lintel et al. | |
| 7,322,803 B2 * | 1/2008 | Vogeley | F04B 9/105 417/413.2 |
| 7,517,201 B2 * | 4/2009 | Cabuz | F04B 43/043 417/413.2 |
| 7,549,298 B2 | 6/2009 | Bash et al. | |
| 7,644,731 B2 * | 1/2010 | Benda | F16K 1/42 137/625.33 |
| 7,652,884 B2 | 1/2010 | Suzuki et al. | |
| 7,679,916 B2 | 3/2010 | Orr et al. | |
| 8,741,234 B2 * | 6/2014 | Wang | G01N 21/05 422/400 |
| 8,807,169 B2 | 8/2014 | Amirouche et al. | |
| 8,956,325 B2 | 2/2015 | Palmier( Michele | |
| 2005/0085018 A1 | 4/2005 | Kim et al. | |
| 2005/0168947 A1 | 8/2005 | Mok et al. | |
| 2006/0007656 A1 | 1/2006 | Symons | |
| 2007/0190685 A1 | 8/2007 | Ebbutt | |
| 2009/0112155 A1 | 4/2009 | Zhao et al. | |
| 2010/0057006 A1 | 3/2010 | Cassemeyer et al. | |

OTHER PUBLICATIONS

Koch; "A Novel Micromachined Pump Based on Thick-film Piezoelectric Actuation"; International Conference on Solid-state Sensors and Actuators Jun. 16-19, 1997.

Nguyen, et al; "Development of a Peristaltic Pump in Printed Circuit Boards"; Journal of Micromechatronics, vol. 00, No, 0; Feb. 2, 2004; pp. 1-13.

Pamula, et al; "Cooling of Integrated Circuits Using Droplet-based Microfluidics"; Duke University; GLSVLSI'03; Apr. 28-29, 2003.

* cited by examiner

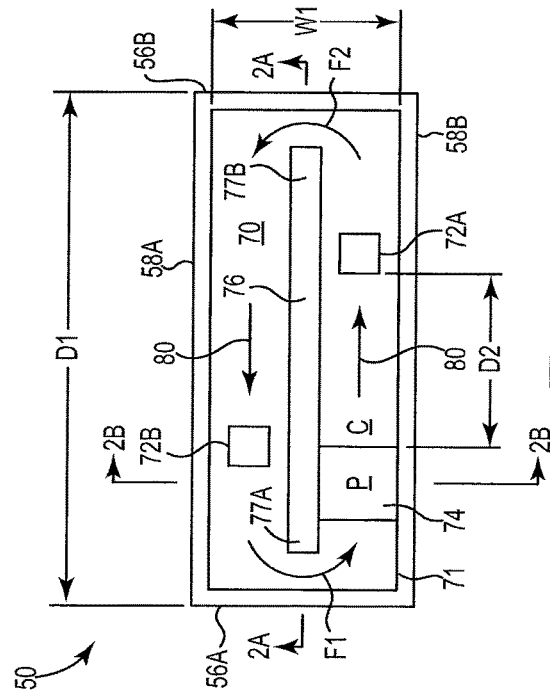
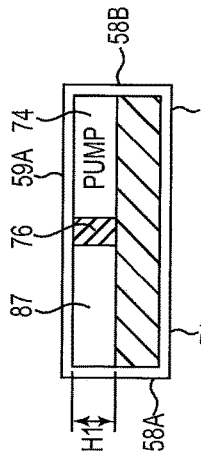
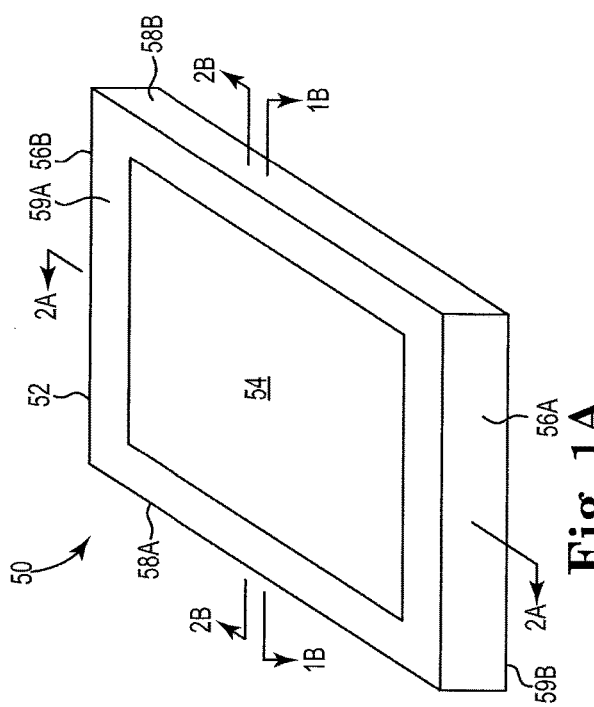
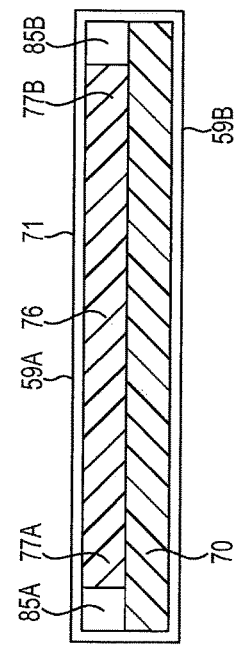

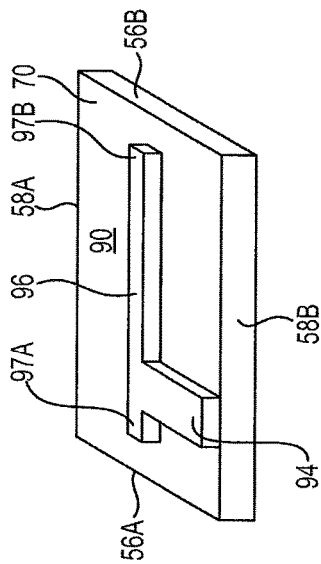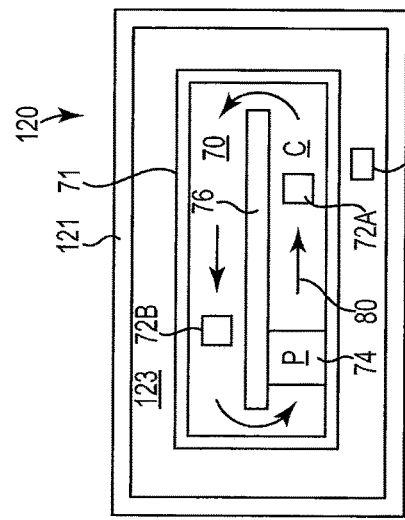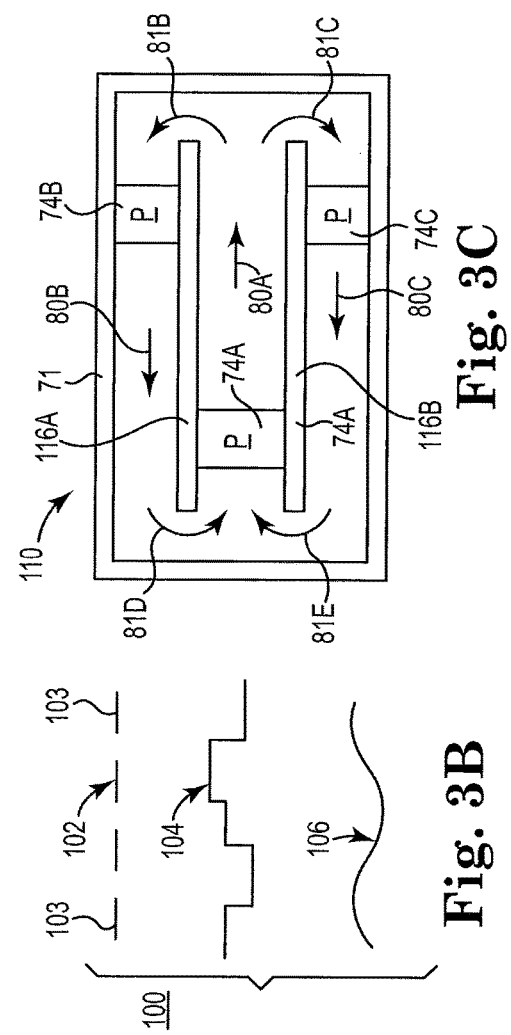

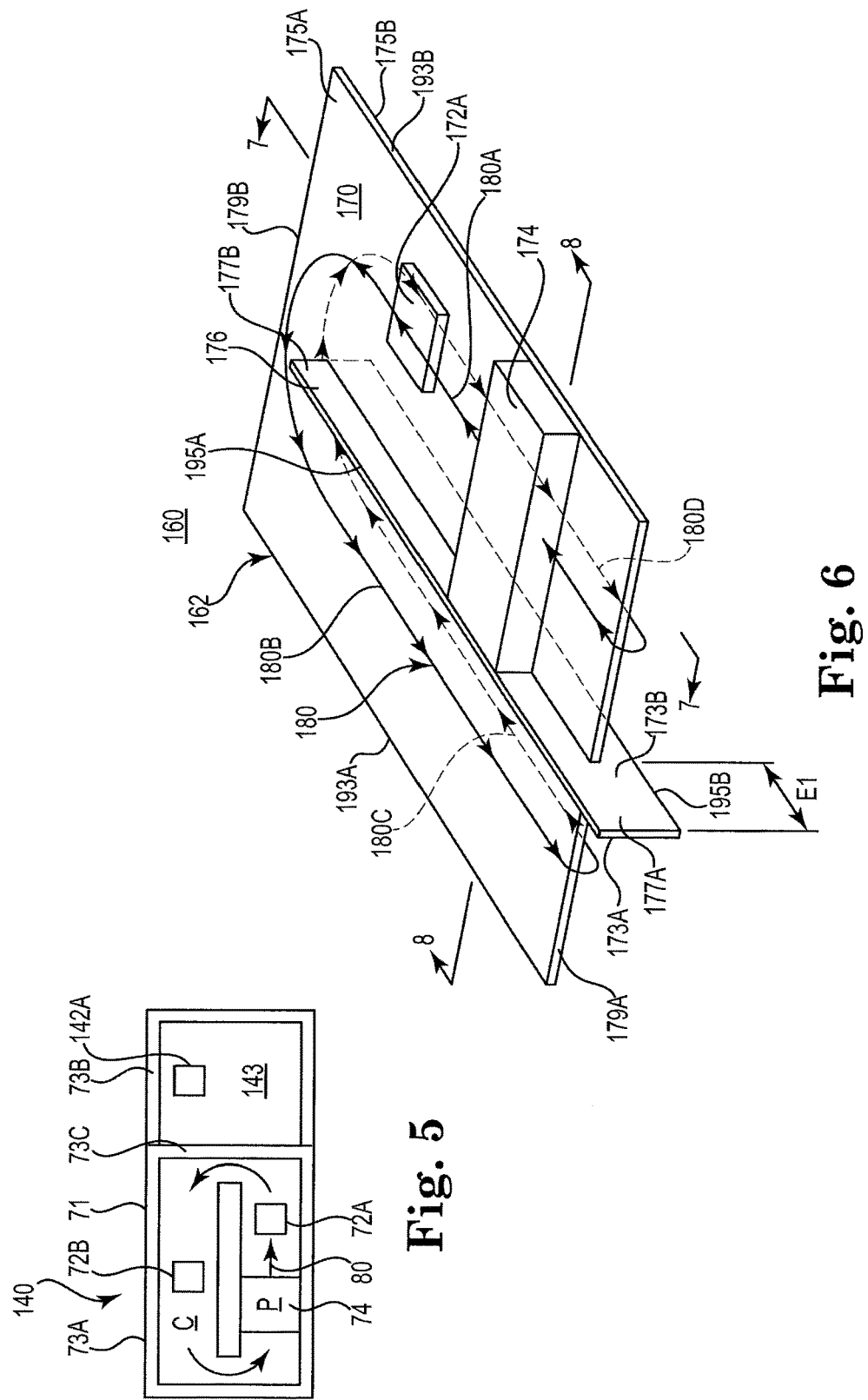

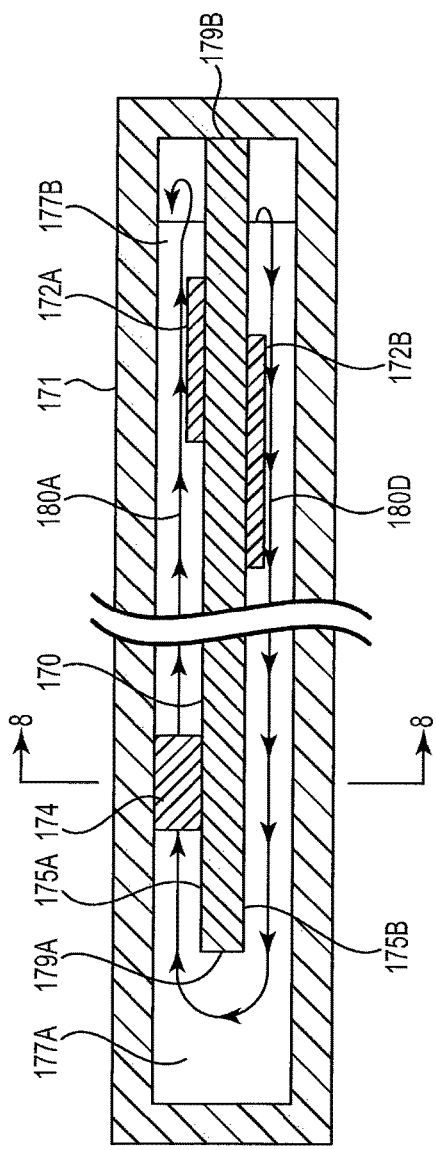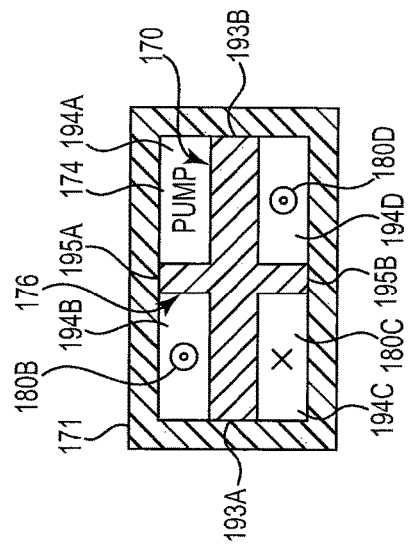

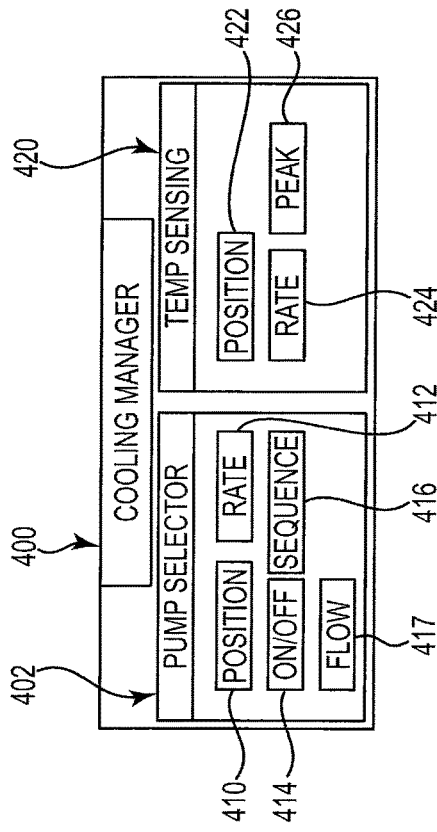
Fig. 10A
Fig. 10B
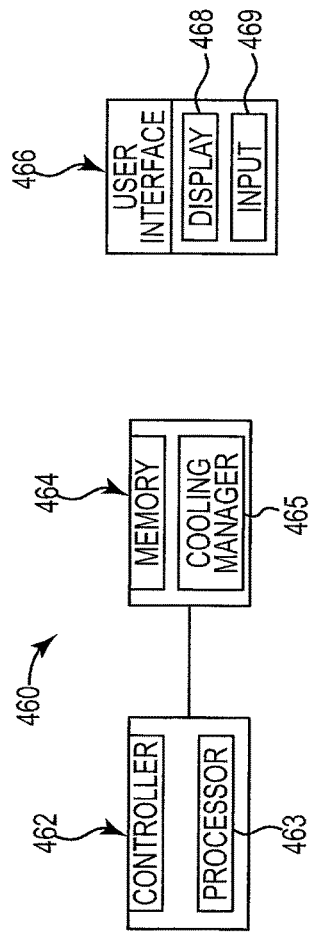
Fig. 10C
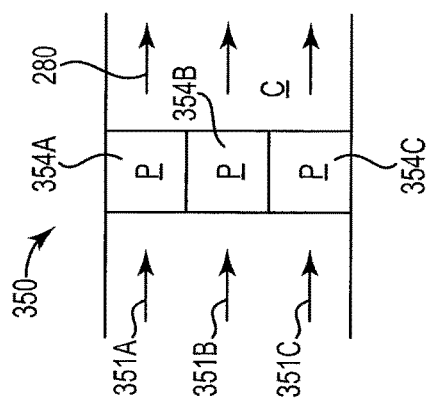
Fig. 10D

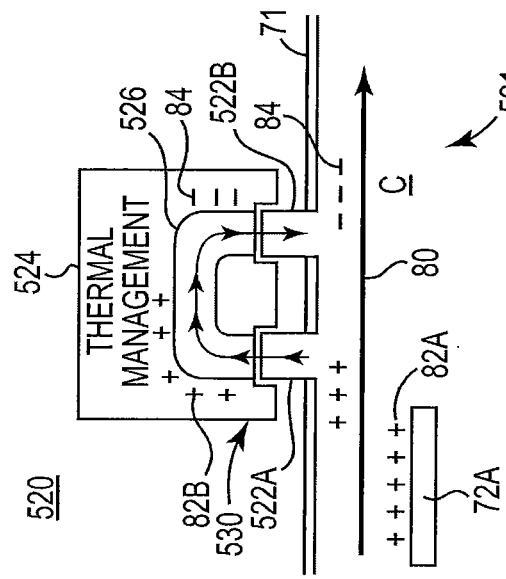
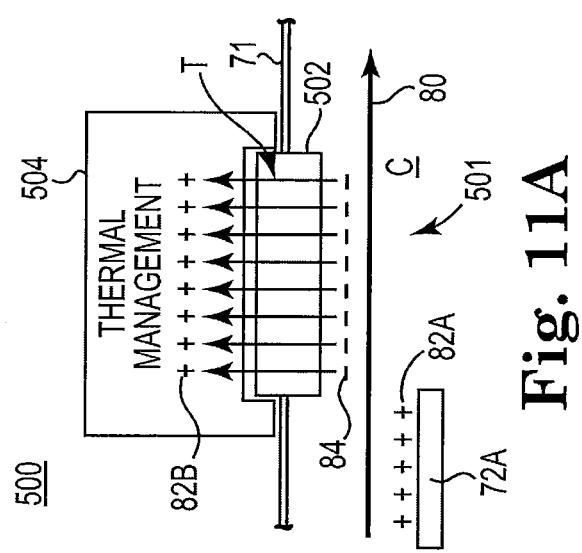
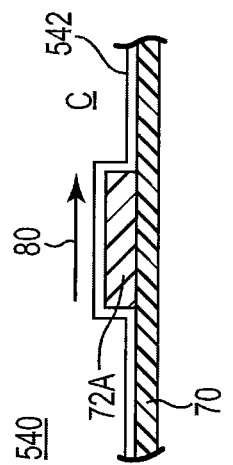

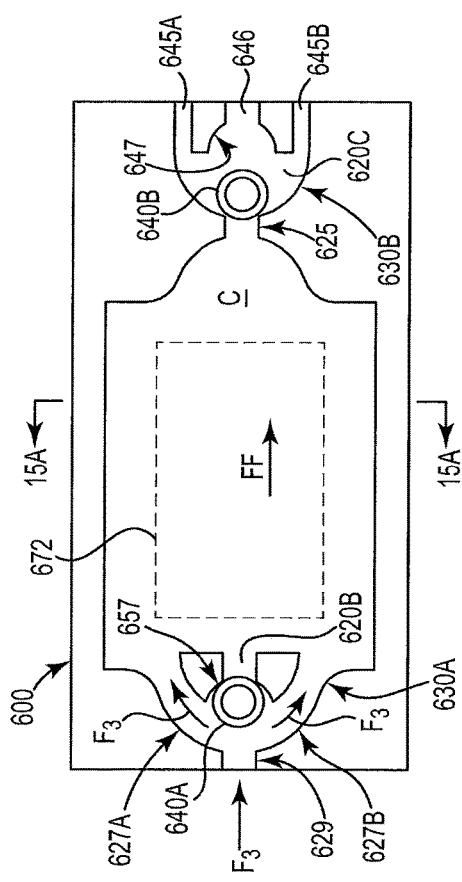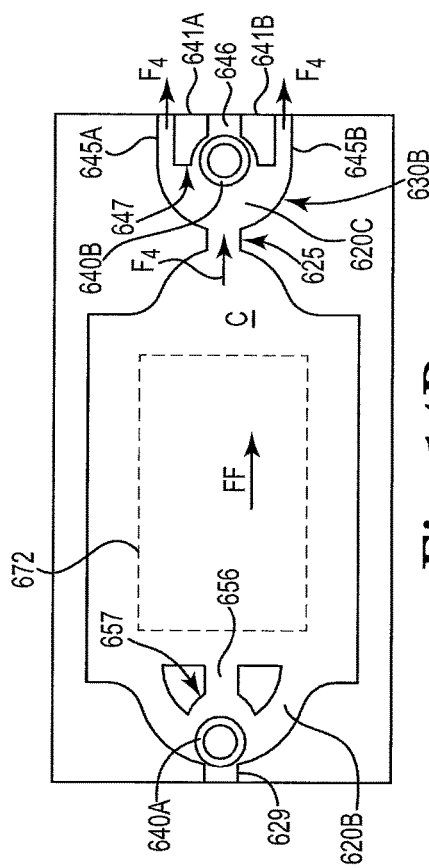

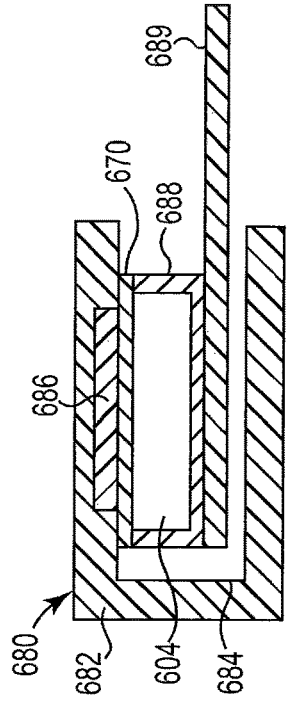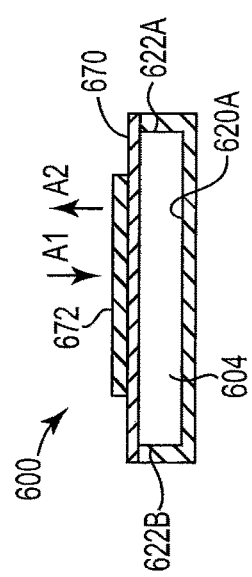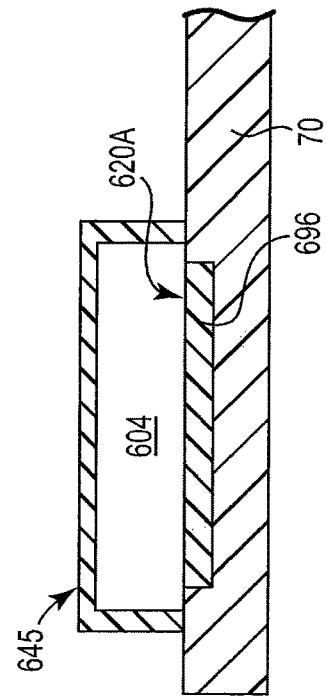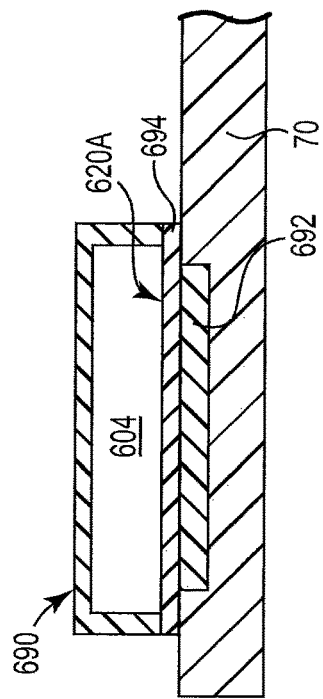

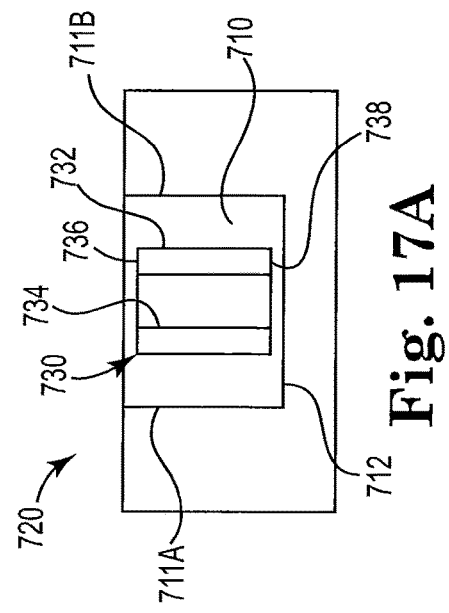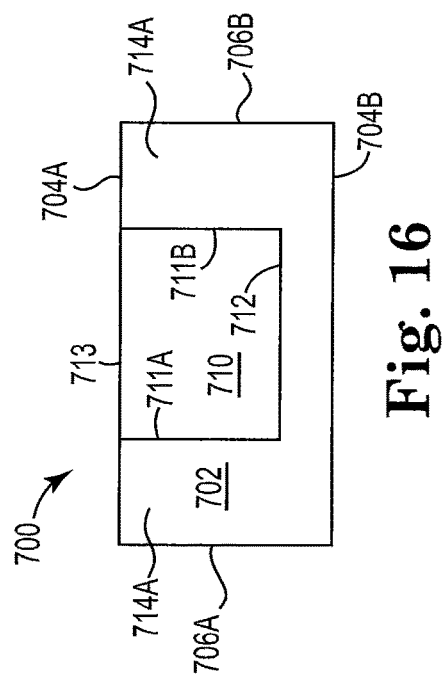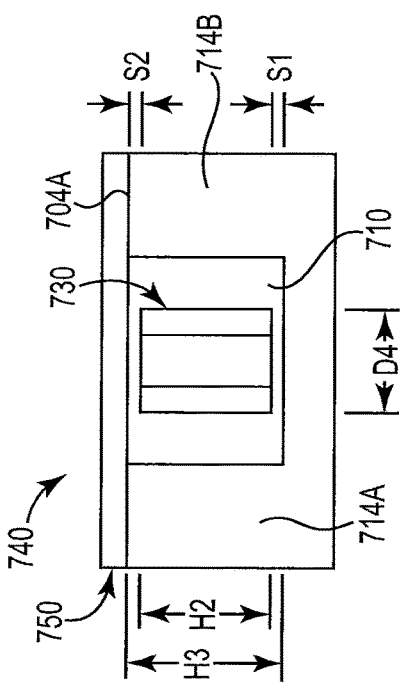

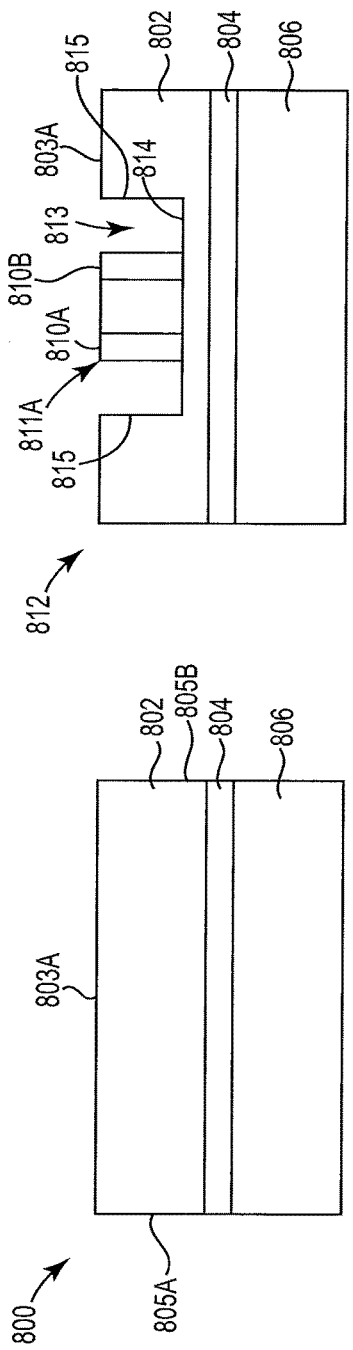
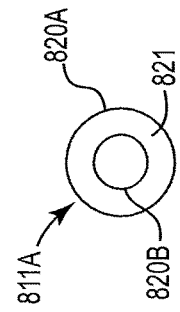
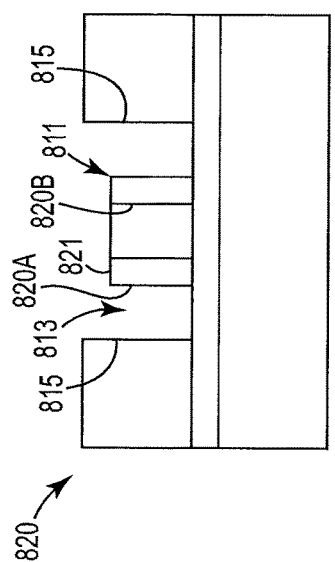
Fig. 21
Fig. 22
Fig. 23A
Fig. 23B

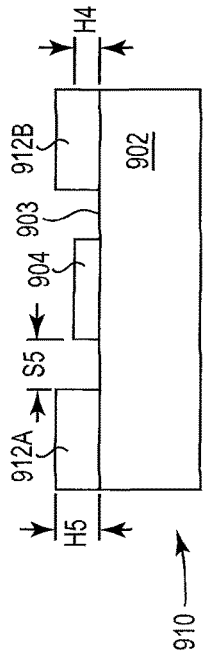
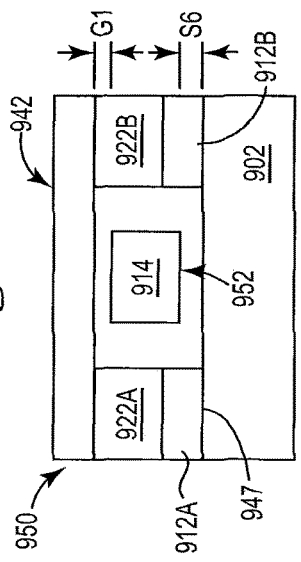
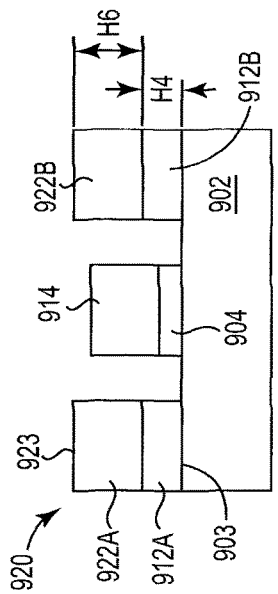
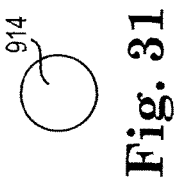

PUMP HAVING FREELY MOVABLE MEMBER

BACKGROUND

Some electronic devices including mobile computing devices, such as tablets, laptop computers, notebook computers, and the like, may allow users to perform computing functions, social media functions, gaming functions, and communicate via email, and the like, in a mobile environment.

Whether or not they are mobile, some electronic devices may allow users to perform medical diagnostic functions, printing functions, etc., which involve moving fluids. In some instances, such fluids may include ink, while in some instances, such fluids may include biological fluids.

BRIEF DESCRIPTION OF THE DRAWINGS

It will be understood that the drawings are used to illustrate at least some examples of the present disclosure and are not intended to limit the scope of the present disclosure.

FIG. 1A is a perspective view schematically illustrating an electronic device, according to one example of the present disclosure.

FIG. 1B is a sectional view as taken along lines 1B-1B of FIG. 1A and providing one schematic illustration of an electronic device, according to one example of the present disclosure.

FIG. 2A is a sectional view as taken along lines 2A-2A of FIGS. 1A-1B and providing one schematic illustration of an electronic device, according to one example of the present disclosure.

FIG. 2B is a sectional view as taken along lines 1B-1B of FIGS. 1A-1B and providing one schematic illustration of an electronic device, according to one example of the present disclosure.

FIG. 2C is a partial sectional view schematically illustrating a portion of an electronic device and demonstrating heat rejection, according to one example of the present disclosure.

FIG. 3A is a perspective view schematically illustrating a substrate with an at least partially formed containment structure and pump, according to one example of the present disclosure.

FIG. 3B is a diagram schematically illustrating various shapes of a barrier of a containment structure, according to one example of the present disclosure.

FIG. 3C is a top plan view schematically illustrating a barrier of an at least partially formed containment structure and pumps, according to one example of the present disclosure.

FIG. 4 is a sectional view as taken from the view of FIG. 1B and providing one schematic illustration of an electronic device, according to one example of the present disclosure.

FIG. 5 is a sectional view as taken from the view of FIG. 1B and providing one schematic illustration of an electronic device, according to one example of the present disclosure.

FIG. 6 is a perspective view schematically illustrating a cooling circulation loop for an electronic device, according to one example of the present disclosure.

FIG. 7 is a sectional view as taken along lines 7-7 of FIG. 6 and providing one schematic illustration of an electronic device, according to one example of the present disclosure.

FIG. 8 is a sectional view as taken along lines 8-8 of FIG. 6 and providing one schematic illustration of an electronic device, according to one example of the present disclosure.

FIG. 10A is diagram schematically illustrating a pump array, according to one example of the present disclosure.

FIG. 10B is a block diagram schematically illustrating a cooling manager, according to one example of the present disclosure.

FIG. 10C is a block diagram schematically illustrating a control portion, according to one example of the present disclosure.

FIG. 10D is a block diagram schematically illustrating a user interface, according to one example of the present disclosure.

FIGS. 11A, 11B are each a block diagram schematically illustrating an external heat exchange mechanism removably coupled to an electronic device, according to one example of the present disclosure.

FIG. 11C is sectional view schematically illustrating a portion of an electronic device, according to one example of the present disclosure.

FIG. 14A is a top plan view schematically illustrating the pump assembly of FIG. 13 in a first state, according to one example of the present disclosure.

FIG. 14B is a top plan view schematically illustrating pump assembly of FIG. 13 in a second state, according to one example of the present disclosure.

FIG. 15A is a sectional view schematically illustrating the valve assembly and an external force applicator, according to one example of the present disclosure.

FIG. 15B is sectional view schematically illustrating a station to which a pump assembly is removably coupled, according to one example of the present disclosure.

FIG. 15C is a sectional view schematically illustrating a pump assembly with an external force applicator mounted in a substrate, according to one example of the present disclosure.

FIG. 15D is a sectional view schematically illustrating a pump assembly with an internally-located force applicator mounted in a substrate, according to one example of the present disclosure.

FIGS. 16-19B are each a sectional view like that taken along lines 16-16 of FIG. 13 and schematically illustrating a portion of a valve during a method of making a pump, according to one example of the present disclosure.

FIGS. 21-26 are each a sectional view like that taken along lines 16-16 of FIG. 13 and schematically illustrating a portion of a valve during a method of making a pump, according to one example of the present disclosure.

FIGS. 28A-32 are each a sectional view like that taken along line 16-16 of FIG. 13 and schematically illustrating a portion of a valve during a method of making a pump, according to one example of the present disclosure.

DETAILED DESCRIPTION

Figure 9B:
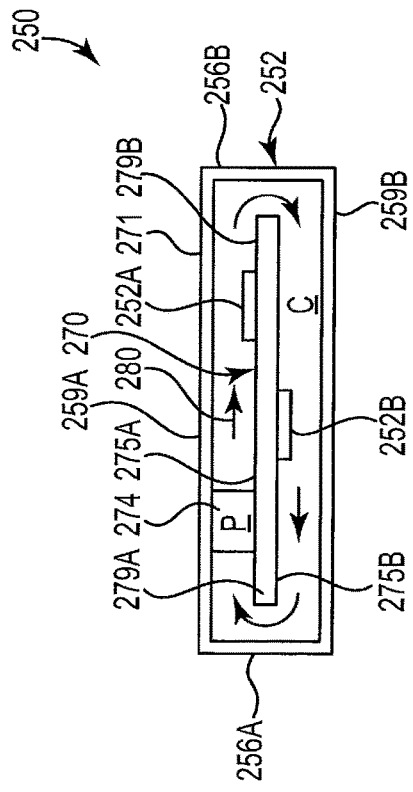
FIG. 9B is a sectional view as taken along lines 9B-9B of FIG. 9A and providing one schematic illustration of an electronic device, according to one example of the present disclosure.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense. It is to be understood that, in some examples, features of the various examples described herein may be combined, in part or whole, with each other, unless specifically noted otherwise.

In at least some examples of the present disclosure, cooling is provided for heat-generating electronic components contained within a sealed housing of an electronic device. In some examples, the electronic device includes at least one barrier to define a circulation loop in which dielectric coolant is exposed to each respective heat-generating electronic component. In some examples, the electronic device includes at least one pump within the sealed housing to cause circulating flow of the coolant throughout the circulation loop. In some examples, the dielectric coolant is exposed to each respective heat-generating electronic component. In some examples, the at least one pump is a unidirectional pump in that the at least one pump generates and permits fluid flow therethrough in just a single direction and prevents fluid flow (through the pump) in an opposite direction.

In some examples, the heat generated by the electronic components is rejected passively through a wall of the sealed housing with the circulating coolant carrying the heat away from the electronic components to enable such heat rejection to occur, in at least, portions of the electronic device that generates no heat or less heat.

In some instances, this arrangement is referred to as an on-board cooling system in that the electronic device is cooled internally without being coupled to an external cooling mechanism or heat exchange device.

However, in some examples, the electronic device includes a heat exchange portion to enable transferring the heat from the coolant, through the heat exchange portion, to a device external to the electronic device for mitigating the heat. In some examples, the heat exchange portion of the electronic device is removably coupled relative to the external heat-mitigating device.

By passively or actively removing heat from an interior of the electronic device, and in particular, away from the heat-generating electronic components within the electronic device, a longevity and/or performance of the heat-generating electronic components may be enhanced. In addition, because some electronic devices are handheld, mitigating heat within the electronic device may result in a more satisfying tactile experience for the user.

In some examples, the various pumps described and illustrated herein are not deployed exclusively for heat mitigation within an electronic device, such as (but not limited to) a mobile computing device, tablet, phablet, etc. but instead are deployed for moving fluids within at least a portion of a fluid ejection system or other microfluidic devices, such as (but not limited to) a bio-chip diagnostic device or a fluid ejection system. In some examples, such pumps are unidirectional pumps in that they generate and permit fluid flow in just a single direction (through the pump) and prevent flow in an opposite direction through the pump.

In some examples, the electronic components within the electronic device are sealed with an electrically-isolating membrane such that a coolant with non-dielectric (e.g. electrically conductive) or semi-dielectric properties may be used instead of using a dielectric (e.g. relatively electrically inert) coolant.

In some examples, a pump includes a main chamber and a pair of valves on opposite ends of the main chamber. The valves may include an inlet valve and an outlet valve, wherein the respective inlet valve and outlet valve each contain a freely movable member to enable selectively opening and closing each respective valve. In some examples, the outlet valve is external to the main chamber. An at least partially elastic membrane may define at least one wall of the main chamber. A force applicator may be coupled to the at least partially elastic membrane to alternately induce a suction action and an expulsion action in the main chamber. In the suction action, the inlet valve is open and the outlet valve is closed. In the expulsion action, the inlet valve is closed and the outlet valve is open. In some examples, the term "closed" refers to providing at least a significant obstruction and does not necessarily mean that a valve is completely sealed, as further described later.

In some examples, as used herein the term "freely movable member" refers to the ability of a member to move in an unrestrained manner within the boundaries (e.g. walls) of a valve (e.g. inlet valve, outlet valve) in response to fluid flow pressure, such as may be exerted by a main chamber of the pump. In other words, while a freely movable member cannot escape the boundaries of the valve, the member is not bound or tethered to a wall defining the interior (e.g. chamber portion) of the valve.

In some examples, the main chamber and valves are molded or otherwise formed as a single, unitary piece and a freely movable member is placed in a chamber portion at least partially forming the respective inlet and outlet valves. In some examples, the structure of the main chamber, valve chambers, and the freely movable member are formed via layers, with the freely movable member starting as a separable structure within the layers and then being later separated (to become free) via removal of a sacrificial portion of one of the layers.

In some examples, formation of a pump is integrated with or performed generally contemporaneously with microfabrication of other circuitry and structures on a printed circuit board (or other substrate) such that at least some of the same materials and same fabrication steps used to form such other circuitry and structures may be used to form at least some components of the pump. In some examples, this arrangement includes forming the pump within and amidst the components of the other circuitry and structures of the substrate. In this way, fabrication of such pumps can be rapidly achieved without involving a wholly separate fabrication scheme and later attachment of the pump (relative to the other circuitry and structures of the printed circuit board) that otherwise might be involved.

At least some of these examples, and additional examples, are described and illustrated throughout the present disclosure in association with at least FIGS. 1A-34.

As used herein, no intended substantive difference is intended between the use of the terms "comprising" and "including", and such terms may be used interchangeably with each term referring to a particular item having at least, but possibly more elements than, the elements identified after the term "comprising" or the term "including."

FIG. 1A is a perspective view of an electronic device 50, according to one example of the present disclosure. Electronic device 50 may take many different forms and be used for many different purposes, just some of which are identified below. In some examples, the electronic device may take the form of a mobile computing device, such as a mobile phone, a tablet, a phablet, etc. In some examples, the electronic device is not mobile. In some examples, the electronic device comprises a bio-chip diagnostic device providing microfluidic structures to receive and process a biologic sample for on-board diagnostic testing. In some examples, electronic device 50 comprises a fluid ejection system, such as but not limited to, an inkjet printing system.

As shown in FIG. 1A, the electronic device 50 includes a housing 52 defining an enclosure. The housing 52 includes opposite ends 56A, 56B and opposite sides 58A, 58B, as well as a top portion 59A and an opposite bottom portion 59B. In some examples, a display or user interface 54 is provided on top portion 59A. However, in some examples the electronic device 50 omits an externally accessible user interface 54.

While FIG. 1A depicts electronic device 50 as having a housing 52 formed as a generally rectangular shape, it will be understood that in some examples, housing 52 may be formed in other shapes, such as triangular, spherical, n-gon, etc.

FIG. 1B is a sectional view as taken along lines 1B-1B of FIG. 1A and providing one schematic illustration of an electronic device, according to one example of the present disclosure. As shown in FIG. 1B, housing 52 of electronic device 50 includes a wall 71 to sealingly contain at least certain components, which may include at least one electronic component 72A on a printed circuit board 70 or other substrate. In at least this context, the term "sealingly contain" refers to isolating the internal components of the electronic device 50 from the environment (e.g. fluids, air, etc.) external to the electronic device 50, preventing any contents (e.g. coolant) within the electronic device 50 from exiting the electronic device 50, and providing a physical barrier to maintain elements (e.g. 72A, printed circuit board or substrate 70, coolant, etc.) within the housing 52 of the electronic device 50.

In some examples, the at least one electronic component 72A is referred to as a heat generating member. In some examples, electronic device 50 may include additional electronic components, such as electronic component 72B. It will be understood that electronic device 50 is not limited to a particular quantity of electronic components (e.g. 72A, 72B).

In some examples, the electronic components 72A or 72B may comprise a central processing unit (CPU), memory, input/output circuitry, power-related components, other circuitry, etc.

In some examples, the electronic components (e.g. 72A, 72B) are spaced apart from each other over the surface of the printed circuit board 70.

In some examples, a barrier 76 protrudes from (a surface of) the printed circuit board 70 and defines a circulation loop 80 through which dielectric coolant may flow, as directed by pump 74. In some examples, as shown in FIG. 1B, the barrier 76 extends along a substantial portion of a length (D1) of the electronic device 50 with barrier 76 having a pair of opposite ends 77A, 77B about which the dielectric coolant flows, as represented by directional arrows F1, F2. As shown in FIG. 2A, gaps 85A, 85B at opposite ends 77A, 77B permit the coolant to circulate about barrier 76.

In some examples, the sealed housing 52 and barrier 76 contains a closed and fixed volume of coolant (C), which facilitates a lower energy usage than otherwise would occur if an open fluid system were employed.

In some examples, the dielectric coolant includes mineral oil or Fluorinert™ electrically-insulating coolant fluid, or Novec™ fluid, both available from 3M™ Company of St. Paul, Minn.

In some examples, the electronic components (e.g. 72A, 72B) within the electronic device 50 are sealed with an electrically-isolating membrane such that a coolant (C) with non-dielectric or semi-dielectric properties may be used instead of using a dielectric (e.g. electrically insulative) coolant. In some examples, a coolant with non-dielectric properties or semi-dielectric properties may be at least partially electrically conductive. One example of an arrangement permitting the use of non-dielectric or semi-dielectric coolant is described and shown later in association with at least FIG. 11C. Accordingly, while the term dielectric coolant is used generally throughout various examples of the present disclosure, it will be understood that a non-dielectric or semi-dielectric coolant may be used in those examples by implementing a sealing arrangement of the electronic components exposed to the coolant as shown in FIG. 11C or via a similar arrangement.

In some examples, barrier 76 is made of a plastic or epoxy molding compound (EMC).

In some examples, housing 71 defines an outer shell of the electronic device 50 and provides a surface to reject heat to the outside environment, after the dielectric coolant absorbs heat from the electronic components 72A, 72B, as further demonstrated below in association with at least FIG. 2C.

In some examples, the dielectric coolant is exposed to substantially the entire first surface of printed circuit board (on which is mounted the at least one first heat generating member). In some examples, the dielectric coolant is exposed to substantially the entire inner surface of at least one shell portion of the housing 52. In some examples, the dielectric coolant is exposed to the entire inner surface of at least one shell portion of the housing 52.

In some examples, all of the electronic components (e.g. 72A, 72B) on the printed circuit board 70 acting as heat generating members are exposed to the coolant (C). It will be understood that in some examples "all" such electronic components includes pump(s) 74, with the dielectric coolant being exposed to at least internal components of the pump(s) 74.

As further shown in FIG. 1B, housing 52 has a width (W1). In some examples, electronic device 50 provides spacing between the pump 74 and electronic component 72A (e.g. heat generating member), as represented by indicator D2.

In some examples, the pump 74 is positioned within the circulation loop to cause circulating flow of the dielectric coolant about barrier 76. In some examples, pump 74 extends transversely to the direction of flow of the dielectric coolant and occupies an entire width of the circulation loop between barrier 76 and the wall 71 at side 58B of the housing 52, as shown in at least FIG. 1B and the sectional view of FIG. 2B. As further shown in FIG. 2B, in some examples, on a side of the barrier 76 opposite to pump 74, housing 52 defines a passage 87 through which coolant flows along the circulation loop 80.

In some examples, the pump 74 as described in the examples in association with at least FIGS. 1B-10A has the features and attributes as one of the pumps described and illustrated in association with at least FIGS. 13-32.

However, in some examples, the pump 74 as described in the examples in association with at least FIGS. 1B-10A has features and attributes of an off-the-shelf pump that meets the cooling specifications (e.g. dimensions, volume, flow rate, etc.) for a particular electronic device 50. Accordingly, such a pump may have at least some features, attributes, and fabrication different from the pumps described and illustrated in association with at least FIGS. 13-32.

In one aspect, as shown in FIG. 2B, the barrier 76 extends a height (H1) above printed circuit board 70. This height is sufficient to allow the circulating coolant (C) to pass over the heat-generating electronic components.

As shown in FIG. 2C, in operation, coolant (C) passing over an electronic component 72A experiences heat gain 82A (represented by symbols "++++"), and as this coolant travels away from the electronic component 72A, the heat is rejected 84 (represented by symbols "- - -") through the wall 71 of housing 52 (represented by arrows E) to the external environment 82B.

FIG. 3A is a perspective view schematically illustrating at least a partially formed fluid containment structure on a substrate 90, according to one example of the present disclosure. In some examples, substrate 90 comprises a printed circuit board. In some examples, substrate 90 comprises at least some of substantially the same features and attributes as printed circuit board 70, as previously described in association with at least FIG. 1B.

As shown in FIG. 3A, in some examples, at least a portion of a pump 94 is monolithic with at least a portion of the substrate 90. In other words, at least a portion of the pump 94 is formed in a manner to protrude from the substrate 90 such that once the pump 94 is formed, a portion of the pump 94 and a portion of the substrate 90 form a single unitary member.

As shown in FIG. 3A, in some examples, at least a portion of barrier 96 is monolithic with a portion of the substrate 90. In other words, at least a portion of the barrier 96 is formed in a manner to protrude from the substrate 90 such that once the barrier 96 is formed, the barrier 96 and at least a portion of the substrate 90 form a single unitary member.

With this in mind, in some examples the pump 94 is at least partially formed generally contemporaneously with a portion of the substrate 90, in contrast to an arrangement in which the pump could be formed separately and then attached to the printed circuit board. In some examples, the barrier 96 is at least partially formed contemporaneously with a portion of the substrate 90, in contrast to an arrangement in which the barrier 96 could be formed separately and then attached to the substrate 90. In some examples, the at least partial contemporaneous formation includes the pump 94 or barrier 96 being at least partially formed using at least some of the same materials being used to form a portion of the substrate 90 and at generally the same time that the portion of the substrate 90 is being formed. For instance, formation (or removal) of a single layer during fabrication of the pump 94 and/or barrier 96 may cause formation of at least part of the pump 94 or of the barrier 96 simultaneous with formation of at least part of the portion of the substrate 90.

At least some examples of formation of the pump and/or barrier contemporaneous with a substrate are later described and illustrated in association with at least FIGS. 21-32.

Such arrangements can greatly simplify and expedite manufacture of electronic devices including such cooling mechanisms via a fluid containment system.

In some examples, the barrier 96 is formed from the same material used to form the substrate 90 and/or to form the pump 94, while in some examples, the barrier 96 is formed from a different material than the substrate 90 and/or pump 94.

In some examples, barrier 96 includes opposite ends 97A, 97B in a manner similar to barrier 76 to enable flow of coolant (C) through gaps like gaps 85A, 85B in FIG. 2A.

It will be understood that in some examples, exposure of the coolant to "all" heat generating members within the housing 52 includes the at least one pump being classified as a heat generating member. In this instance, the coolant is directly exposed to at least some internal components of the pump and thereby provides cooling for the pump.

However, in some examples, a reference to the coolant being exposed to all the heat generating members within the housing 52 excludes the at least one pump because in that instance, the dielectric coolant (C) is exposed to the internals of the pump 74 and not to an exterior of the pump 74.

In some examples, dielectric coolant (C) is exposed to substantially the entire wall 71 of the sealed housing 52 generally facing the electronic components 72A, 72B such that a relatively large surface area is provided to facilitate heat rejection from the coolant (C) through wall 71 to the external environment. In some examples, the portion of wall 71 acting as heat rejection tool has a surface area at least one order of magnitude greater than a surface area of at least some of the electronic components 72A, 72B. In some examples, the portion of wall 71 acting as heat rejection tool has a surface area at least two orders of magnitude greater than a surface area of at least some of the electronic components 72A, 72B. In one aspect, this large differential in relative surface area facilitates heat rejection from the coolant to the external environment.

FIG. 3B is diagram 100 including a top plan view schematically illustrating an array of differently shaped barriers 102, 104, 106 of a containment system, according to one example of the present disclosure. In some examples, one of these shaped barriers is substituted for one of the barriers (e.g. 76) of one of the fluid containment systems of an electronic device described and illustrated throughout the examples of the present disclosure. As shown in FIG. 3B, in some examples barrier 102 takes the form of a series of barrier portions 103 with small gaps present between the adjacent barrier portions 103. As shown in FIG. 3B, in some examples barrier 104 has a patterned shape in which different portions of the barrier 104 are not aligned in single, linear path. Such a barrier 104 may be implemented to route the barrier 104 among and around existing structures and/or electronic components on a substrate (e.g. substrate 90).

As shown in FIG. 3B, in some examples barrier 106 has a curved or undulating shape. In some examples, such a barrier may be employed within an electronic device having at least some curved shapes and/or to accommodate curved structures and/or electronic components on the substrate 90.

In some examples, such a barrier may enhance smooth coolant flow within the electronic device 50.

FIG. 3C is a sectional view like that of FIG. 1B and schematically illustrating an electronic device 110, according to one example of the present disclosure. In some examples, the electronic device 110 includes at least some of substantially the same features and attributes as electronic device 50 (at least FIG. 1B), except for providing a barrier structure including at least two generally parallel barriers 116A, 116B. Each barrier 116A, 116B functions like barrier 76 in FIG. 1B, except for providing additional lanes (e.g. 80A, 80B, 80C) of coolant flow. As shown in FIG. 3C, in some examples each lane 80A, 80B, 80C includes its own pump 74A, 74B, 74C, respectively, to ensure proper coolant flow along the barriers 116A, 116B (as represented by directional arrows 80A, 80B, 80C) and around the ends of each barrier 116A, 116B (as represented by directional arrows 81B, 81C and 81D, 81E). In some examples, a robust circulatory flow is ensured as shown in FIG. 3C via placing one pump (e.g. 74A) near one end of the electronic device between barriers 116A, 116B to create flow in a first direction (e.g. 80A) and via placing the other two pumps (e.g. 74B, 74C) near an opposite end of the electronic device outside the barriers 116A, 116B to create flow in an opposite second direction (e.g. 80B, 80C) to cause return of the coolant to the pump 74A.

In some examples, fewer or greater than three pumps (e.g. 74A, 74B, 74C) may be employed. In some examples, the pumps may be positioned differently than shown in FIG. 3C. In some examples, fewer or greater than two barriers 116A, 116B may be employed.

FIG. 4 is a sectional view of an electronic device like the sectional view taken along lines 1B-1B in FIG. 1A, except with FIG. 4 depicting an electronic device 120 having a non-circulation zone 123 external to and at least partially surrounding wall 71 of housing 52, and therefore external to circulation loop 80 within wall 71. Accordingly, in one respect, wall 71 acts to define one barrier, which at least partially defines circulation loop 80. In one aspect, wall 71 (and circulation loop 80) is nested within non-circulation zone 123.

As further shown in FIG. 4, in some examples non-circulation zone 123 omits any electronic components, while in some examples, non-circulation zone 123 may include some electronic components, such as electronic component 122A. In some examples, electronic component 122A produces heat in a quantity or at a rate that is one order of magnitude less than a quantity or rate at which electronic components 72A, 72B (contained within wall 71) produces heat.

FIG. 5 is a sectional view like the sectional view of FIG. 1B, except having a non-circulation zone 143 external to circulation loop 80. Non-circulation zone 143 is at least partially defined by wall 73B and may include an electronic component 142A.

In some examples, an electronic device may have multiple, independent circulation loops, which may be arranged in a nested manner or side-by-side.

In some examples, with regard to the examples described in association with at least FIGS. 4-5, the respective electronic components (e.g. 122A in FIG. 4, 142A in FIG. 5) located in the respective non-circulation zone (e.g. 123 in FIG. 4, 143 in FIG. 5) may comprise a heat generating member, which produces heat at least an order of magnitude less than the heat generated by the respective electronic components (e.g. 72A, 72B) in the circulation loop 80 (e.g. circulation zone). In some examples, the electronic components (e.g. 122A, 142A) in the non-circulation zone (123, 143) produce heat at least two orders of magnitude less than the heat generated by the respective electronic components in the circulation loop 80.

FIG. 6 is a diagram 160 including a perspective view schematically illustrating a cooling circulation loop 180 for an electronic device 162, according to one example of the present disclosure. In some examples, electronic device 162 includes at least some of substantially the same features and attributes as electronic device previously described and illustrated in association with at least FIGS. 1A-5, except having a circulation cooling loop 180 which extends on both sides of a printed circuit board 170. In particular, as shown in FIG. 6, printed circuit board 170 includes opposite ends 179A, 179B, opposite side edges 193A, 193B, and a top surface 175A and opposite bottom surface 175B.

As further shown in FIG. 6, electronic device 162 includes a barrier 176 protruding from at least surfaces 175A, 175B of printed circuit board 170 with barrier 176 having opposite ends 177A, 177B, opposite sides 173A, 173B, and opposite top and bottom edges 195A, 195B. In some examples, end 177A of barrier 176 extends beyond end 179A of printed circuit board 170 by a distance E1. In some examples, end 179B of printed circuit board 170 extends beyond end 177B of barrier 176 by a distance comparable to E1.

As further shown in FIG. 6, electronic device 162 also includes a pump 174 positioned on and/or formed on surface 175A of printed circuit board 170, and extending from side 173B of barrier 176 to side edge 193B of printed circuit board 170. As shown in FIG. 6, electronic device 162 includes at least one electronic component 172A, which may be heat-generating member.

Circulation loop 180 includes a first segment 180A and a second segment 180B, both of which travel or extend over top surface 175A of printed circuit board 170, and as such provide for circulating cooling flow over electronic component 172A. Meanwhile, third segment 180C and fourth segment 180D (of circulation loop 180) extend over bottom surface 175B of printed circuit board 170, and as such provide for circulating cooling flow over any electronic components, such as component 172B present on bottom surface 175B of printed circuit board 170, as shown in FIG. 7. Moreover, the sectional view of FIG. 7 (as taken along lines 7-7 of FIG. 6) further illustrates segment 180A of circulation loop 180 over top surface 175A of printed circuit board 170 and segment 180D underneath bottom surface 175B of printed circuit board 170.

FIG. 8 is a sectional view as taken along lines 8-8 of FIG. 6 and further schematically illustrating electronic device 162, according to one example of the present disclosure. As shown in FIG. 8, printed circuit board 170 and barrier 176 effectively divide the enclosure (defined by housing wall 171) into quadrants (193A, 193B, 193C, 193D) with each quadrant corresponding to one of the respective segments (180A, 180B, 180C, 180D) of circulation loop 180.

In one aspect, this arrangement provides for cooling in situations in which a printed circuit board 170 has electronic components on opposite surfaces 175A, 175B and in which cooling of both sides of the printed circuit board 170 is desired.

Figure 9C:
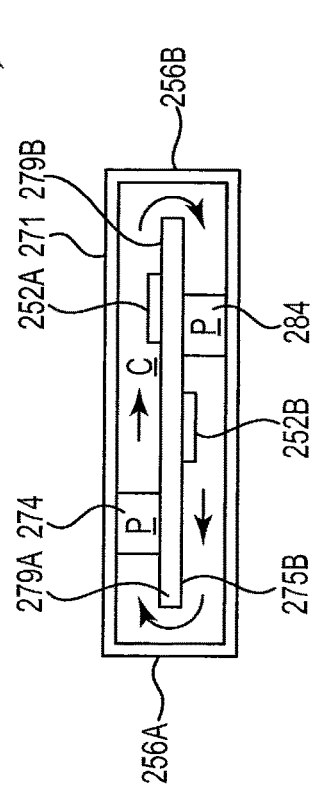
FIG. 9C is a sectional view as taken along lines 9B-9B of FIG. 9A and providing one schematic illustration of an electronic device, according to one example of the present disclosure.
Figure 9A:
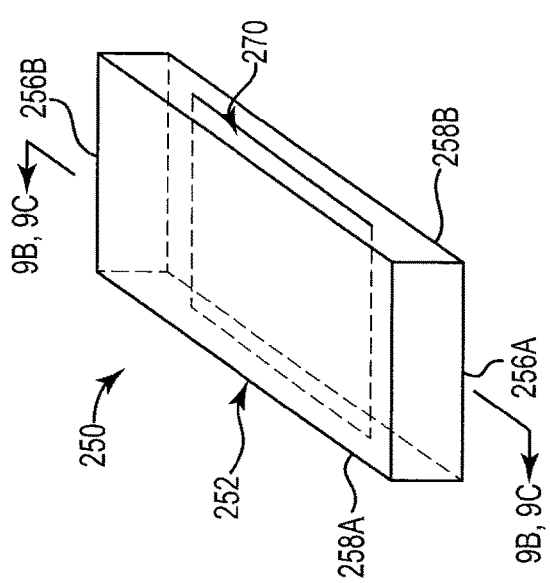
FIG. 9A is a perspective view schematically illustrating an electronic device, according to one example of the present disclosure.

FIG. 9A is a perspective view schematically illustrating an electronic device 250, according to one example of the present disclosure. In some examples, electronic device 250 includes at least some of substantially the same features and attributes as the electronic devices as previously described and illustrated in association with FIGS. 1A-8, except for a printed circuit board 270 exclusively defining the barrier which defines and creates the circulation loop. In other words, in the example of electronic device 250 no separate barrier (such as barrier 176 in the example of FIGS. 6-8) was provided in addition to the printed circuit board 270 shown in FIGS. 9A-9C.

FIG. 9B is a sectional view as taken along lines 9B-9B of FIG. 9A and providing one schematic illustration of an electronic device 250, according to one example of the present disclosure. As shown in FIG. 9B, electronic device 250 includes a housing 252 sealingly containing printed circuit board 270 on which electronic components (e.g. heat generating members) 252A, 252B are present and exposed to dielectric coolant flowing along circulation loop 280 via action of pump 274.

Because side edges of printed circuit board 270 are sealingly secured to the sides 258A, 258B of a wall 271 of housing 252 (FIG. 9A), the coolant flows about the ends 279A, 279B of printed circuit board 270 such that printed circuit board 270 acts as the barrier defining the circulation loop 280. In one example arrangement, sealingly securing the side edges 258A, 258B prevents fluid (e.g. coolant) from passing between the side edges 258A, 258B and the wall 271 of housing 252.

FIG. 9C is a sectional view as taken along lines 9B-9B of FIG. 9A and providing one schematic illustration of an electronic device 252, according to one example of the present disclosure. In some examples, electronic device 252 comprises the same features and attributes as electronic device 250, except for having an additional pump 284 on a bottom surface 275B of printed circuit board 270 so that each surface 275A, 275B has a pump to facilitate coolant flow through the circulation loop 280.

FIG. 10A is diagram schematically illustrating a pump array 350, according to one example of the present disclosure. As shown in FIG. 10A, the pump array 350 includes three pumps 354A, 354B, 354C arranged in an orientation generally parallel relative to the direction of the coolant flow in the circulation loop. In one aspect, the three pumps extend transversely across substantially the entire width of the circulation loop. It will be understood that in some examples, pump array 350 includes more than three pumps and in some examples, pump array 350 includes fewer than three pumps. As shown in FIG. 10C, each pump 354A, 354B, 354C draws a portion 351A, 351B, 352C of coolant (C) across a width of the lane defining the circulation loop 280 to facilitate relatively uniform fluid flow.

In some examples, as further shown in FIG. 10A, the array 350 of pumps is arranged in a line generally perpendicular to a direction of coolant flow along the circulation loop 280. In some examples, a barrier (e.g. 76 in FIG. 1B) defines the circulation loop as a lane and the array 350 of pumps completely occupies the lane. In some examples, the array 350 of pumps defines a segment of the circulation loop 80 with the array 350 of pumps extending transversely to the direction of flow and extending between the barrier and a side edge of the housing enclosure.

In some examples, an array of pumps are spaced apart from each other and arranged in series along a length of a circulation loop in an orientation generally parallel to a direction of flow in the circulation loop.

FIG. 10B is a block diagram schematically illustrating a cooling manager, according to one example of the present disclosure. In some examples, cooling manager 400 acts to manage flow of the dielectric coolant through the circulation loop to achieve desired management of the temperatures of the electronic components within the electronic device. In some examples, cooling manager 400 includes a pump selector module 402. In some examples, cooling manager 400 includes a temperature sensing module 420. In some examples, cooling manager 400 includes both the pump selector module 402 and the temperature sensing module 420.

In some examples, pump selector module 402 includes a position function 410, a rate function 412, an on/off function 414, and a sequence function 416. In general terms, per position function 410 the pump selector module 402 determines how many pumps to activate and which pump to activate based, at least in part, on the relative position of a pump(s) relative to the electronic components to be cooled. Meanwhile, rate function 412 tracks and determines a flow rate to be produced by the pump(s). In some examples, each pump is individually activated or deactivated per on/off function 414, depending upon the demand for flow at a particular time. In some examples in which all the pumps are not activated to pump simultaneously, the sequence function 416 tracks and determines a sequence by which the different pumps are activated.

In some examples, the pump selector module 402 includes a flow sensing function 417 to track a rate of coolant flow, with the flow sensing being performed at some pumps and/or at some electronic components within the housing of the electronic device.

In some examples, operation of pump selector module 402 depends at least partially on sensed temperatures within the electronic device.

In some examples, in general terms the temperature sensing module 420 tracks temperatures within the interior of the electronic device, and in particular temperatures at or near the electronic components (e.g. heat generating member). In some examples, sensing module 420 includes a position function 422, a rate function 424, and a peak function 426, as further shown in FIG. 10B. The position function 422 identifies a position at which a temperature is sensed, while the rate function 424 tracks a rate of temperature change. The peak function 426 tracks a peak sensed temperature, which may occur at a particular position as tracked by position function 422.

In some examples, the temperature sensors may be internal to at least some of the electronic components within an electronic device. In some examples, the temperature sensors may be external to at least some of the electronic components. In some examples, the temperature sensor may be implemented via estimating the temperate of a particular component at least partially based on a predetermined profile of estimated temperatures (for that component) based on a rate of operations performed by the particular electronic component.

FIG. 10C is a block diagram schematically illustrating a control portion 460, according to one example of the present disclosure. In some examples, control portion 460 includes a controller 462 and a memory 464.

In general terms, controller 462 of control portion 460 comprises at least one processor 463 and associated memories that are in communication with memory 464 to generate control signals to direct operation of at least some components of the systems and components described throughout the present disclosure. In some examples, these generated control signals include, but are not limited to, employing cooling manager 465 to manage coolant flow within an electronic device to thereby manage temperature profiles within an electronic device during operation of the electronic device.

In response to or based upon commands received via a user interface (e.g. user interface 466 in FIG. 10D) and/or via machine readable instructions (including software), controller 462 generates control signals to implement circulation of coolant flow (via a pump) and/or track temperatures in accordance with at least some of the previously described examples and/or later described examples of the present disclosure. In some examples, controller 462 is embodied in a general purpose computer while in other examples, controller 462 is embodied in at least some of the components described throughout the present disclosure, such as one of the electronic components sealingly contained within an electronic device and programmed to at least provide cooling operations within the electronic device.

For purposes of this application, in reference to the controller 462, the term "processor" shall mean a presently developed or future developed processor (or processing resources) that executes sequences of machine readable instructions (such as but not limited to software) contained in a memory. In some examples, execution of the sequences of machine readable instructions, such as those provided via memory 464 of control portion 460 cause the processor to perform actions, such as operating controller 462 to implement a circulating loop of coolant flow or other fluid movement, as generally described in (or consistent with) at least some examples of the present disclosure. The machine readable instructions may be loaded in a random access memory (RAM) for execution by the processor from their stored location in a read only memory (ROM), a mass storage device, or some other persistent storage (e.g., non-transitory tangible medium or non-volatile tangible medium, as represented by memory 464. In some examples, memory 464 comprises a computer readable tangible medium providing non-volatile storage of the machine readable instructions executable by a process of controller 464. In other examples, hard wired circuitry may be used in place of or in combination with machine readable instructions (including software) to implement the functions described. For example, controller 462 may be embodied as part of at least one application-specific integrated circuit (ASIC). In at least some examples, the controller 462 is not limited to any specific combination of hardware circuitry and machine readable instructions (including software), nor limited to any particular source for the machine readable instructions executed by the controller 462.

In some examples, user interface 466 comprises a user interface or other display that provides for the simultaneous display, activation, and/or operation of at least some of the various components, functions, features, and of control portion 460 and/or the various pumping arrangements, as described throughout the present disclosure. In some examples, at least some portions or aspects of the user interface 466 are provided via a graphical user interface (GUI).

In some examples, as shown in FIG. 10D, user interface 466 includes display 468 and input 469. In some examples, display 468 is embodied as display 54 in FIG. 1A.

FIGS. 11A, 11B are block diagrams schematically illustrating an electronic device 501, 521 removably coupled to an external thermal management module, according to one example of the present disclosure. In some examples, except for a mechanism to enable coupling relative to an external thermal management module, the electronic devices 501, 521 comprise at least some of substantially the same features and attributes as the electronic devices previously described and illustrated in association with FIGS. 1-10D.

As shown in FIG. 11A, diagram 500 depicts an electronic device 501 having a heat transfer element 502 positioned at wall 71 of housing 52 to be exposed internally within the circulation loop 80 of coolant (C) and to be exposed externally to, and removably couplable to, an external thermal management module 504. As seen in FIG. 11A, heat 82A (represented by symbols "+++") produced by electronic component 72A is carried by circulating coolant (represented by arrow 80) away from electronic component 72A and toward (and past) heat transfer element 502. Heat transfer element 502, in turn, absorbs the heat 82A and transfers the heat (represented by arrows T) for handling within and by the external thermal management module 504 such that relatively cooler coolant (represented by symbols "– – –") at 84) continues along the circulation loop 80.

As shown in FIG. 11B, diagram 520 depicts an electronic device 521 having a heat transfer portion including heat transfer ports 522A, 522B positioned at wall 71 of housing 52 to be in communication with the circulation loop 80 of coolant (C). The heat transfer ports 522A, 522B are removably couplable to, and in communication with, interface 530 of external thermal management module 524. As seen in FIG. 11B, heat 82A (represented by symbols "+++") produced by electronic component 72A is carried by circulating coolant (represented by arrow 80) away from electronic component 72A. At least some heated coolant exits housing 52 through port 522A for entry into conduit 526 of thermal management module 524 to allow heat to transfer out of the coolant (as represented by symbols "++++"). The coolant completes its journey through conduit 526, re-entering port 522B of electronic device 521 in a relatively cooler state (as represented by symbols "– – –") at 84 to rejoin the remainder of the coolant (C) traveling in the circulation loop 80 within housing 52.

FIG. 11C is a sectional view schematically illustrating a portion of an electronic device 540, according to one example of the present disclosure. In some examples, electronic device 540 includes at least some of substantially the same features and attributes of the electronic devices as previously described in association with at least FIGS. 1-11B. In particular, as shown in FIG. 11C, the electronic device 540 includes a printed circuit board 70 with at least one electronic component 72A mounted thereon. In addition, a membrane 542 sealingly covers at least the electronic component 72A to electrically insulate the circulating coolant (C) from the electronic component 72A. In one aspect, the term "sealingly covers" refers to preventing the coolant (C) from contacting the electronic component 72 and providing the membrane 542 with sufficient thickness and electrical insulating capacity to prevent electrical interaction between the coolant (C) and the electronic component 72A.

While the coolant is generally a dielectric coolant as previously described, by providing the electrically-insulating membrane 542, a greater range of coolants having different dielectric qualities may be employed. In some examples, such coolants may even have non-dielectric or semi-dielectric properties as previously described. In some examples, membrane 542 covers substantially the entire footprint of the printed circuit board 70. In some examples, membrane 542 covers at least some of the electronic components 72A without covering substantially the entire footprint of the printed circuit board 70.

Figure 12:
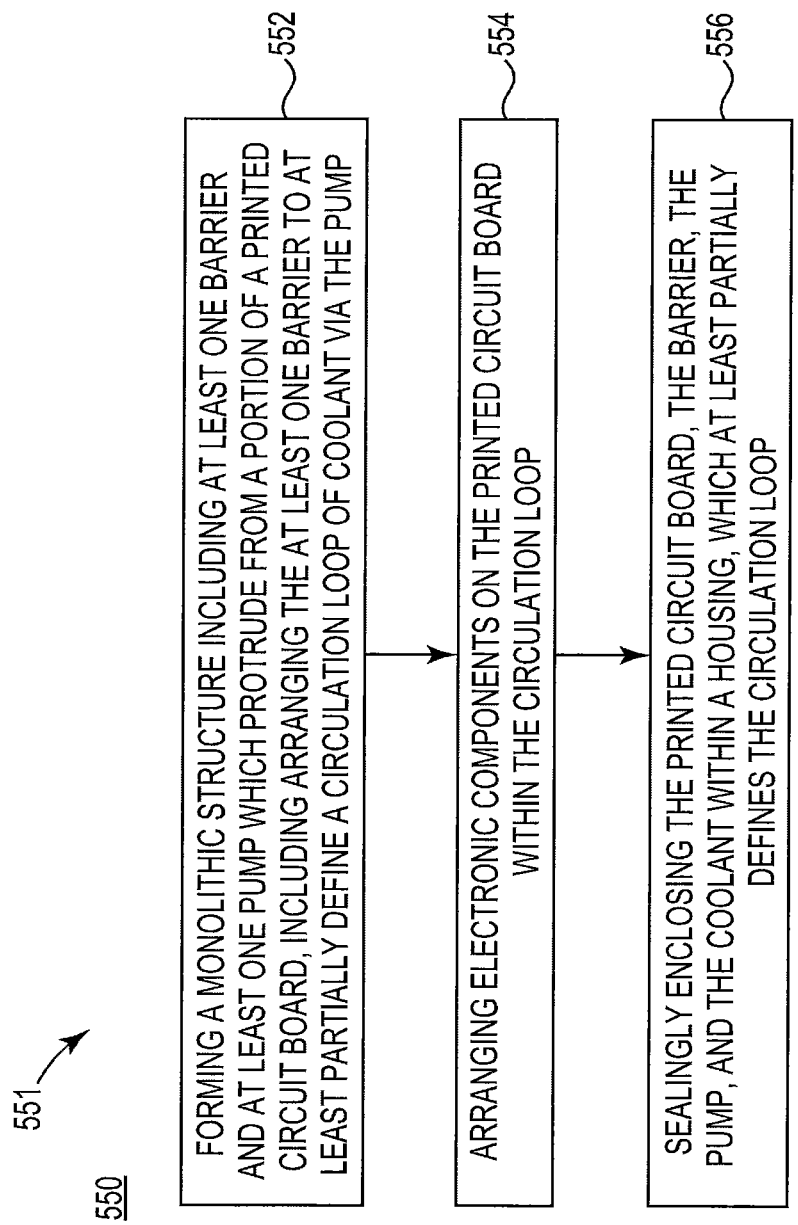
FIG. 12 is a flow diagram schematically illustrating a method of manufacturing an electronic device, according to one example of the present disclosure.

FIG. 12 is a flow diagram 550 schematically illustrating a method 551 of manufacturing an electronic device, according to one example of the present disclosure. In some examples, method 551 is performed using at least some of the functions, components, modules, assemblies, etc. as previously described in association with at least FIGS. 1-11C. In some examples, method 551 is performed using at least some functions, components, modules, assemblies, etc. other than those previously described in association with at least FIGS. 1-11C.

In some examples, at 552 method 551 includes forming a monolithic structure including at least one barrier and at least one pump protruding from a portion of a printed circuit board, including arranging the at least one barrier to at least partially define a circulation loop of coolant moved by the at least one pump. Method 551 also includes arranging electronic components on the printed circuit board within the circulation loop, as shown at 554 in FIG. 12. At 556, method 551 includes sealingly enclosing the printed circuit board, the at least one barrier, the at least one pump, and the coolant within a housing, which at least partially defines the circulation loop.

Figure 13:
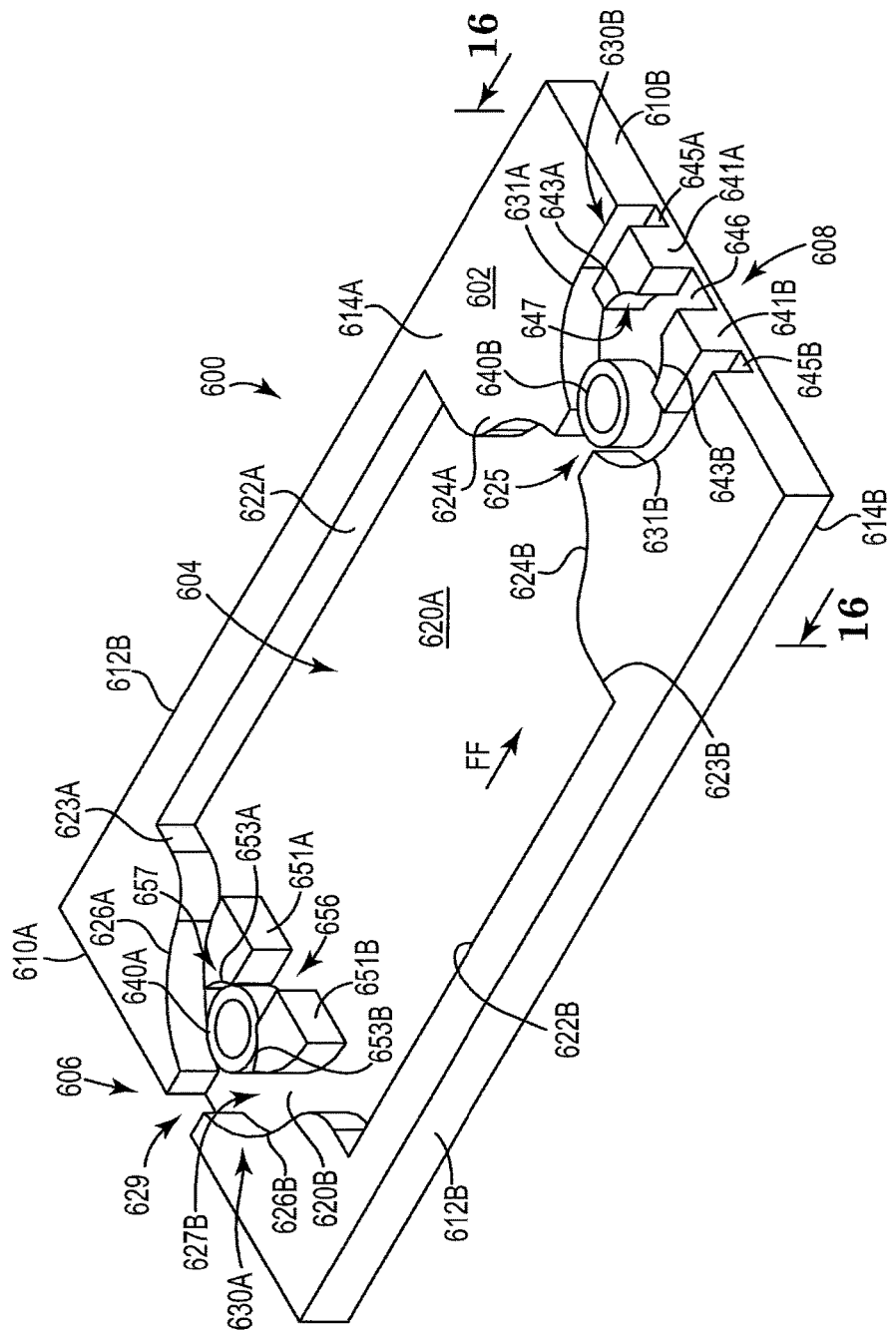
FIG. 13 is a perspective view schematically illustrating at least a portion of a pump assembly, according to one example of the present disclosure.

FIG. 13 is a perspective view schematically illustrating at least a portion of a pump 600, according to one example of the present disclosure. While later described in more detail, it will be understood that for illustrative simplicity, pump 600 as depicted in FIGS. 13-14B is shown without a wall that would otherwise sealingly cover the depicted open portion of the chambers of pump 600. In some examples, the omitted wall comprises an at least partially elastic membrane and in some examples, the omitted wall does not comprise an at least partially elastic membrane.

In some examples, pump 600 serves as the pump 74, 94, 174, 274, 284, 354A-354C, as previously described in association with at least FIGS. 1-11C. FIG. 14A is a top plan view schematically illustrating the pump assembly 600 in a first state, according to one example of the present disclosure. FIG. 14B is a top plan view schematically illustrating the pump assembly 600 in a second state, according to one example of the present disclosure.

As shown in FIG. 13, pump 600 includes main chamber 604, first valve 606, and second valve 608. In some instances, first valve 606 is referred to as an inlet valve and second valve 608 is referred to as an outlet valve. Pump 600 includes opposite ends 610A, 610B, opposite sides 612A, 612B, and opposite first and second surfaces 614A, 614B. Main chamber 604 includes a first wall 620A, opposite side walls 622A, 622B, and partial end walls 623A, 623B. In some examples, first wall 620A comprises a floor or bottom wall 620A. However, in some examples, first wall 620A comprises a wall of chamber portion 630A other than a floor or bottom wall. At one end, main chamber 604 is at least partially further defined by curved walls 624A, 624B and port 625. At the other end, main chamber 604 is at least partially further defined by curved walls 626A, 626B and port 629.

In some examples, external to main chamber 604 (e.g. external to port 625), outlet valve 608 includes a chamber portion 630B at least partially defined by curved walls 631A, 631B, a pair of protrusions 641A, 641B, and first wall 620C. In some examples, first wall 620C comprises a floor or bottom wall 620C of chamber portion 630B. However, in some examples, first wall 620C comprises a wall of chamber portion 630B other than a floor or bottom wall.

The protrusions 641A, 641B are spaced apart from each other to form a central gap 646 and each protrusion 641A, 641B is spaced apart from a respective one of the curved walls 631A, 631B to form a gap 645A, 645B. Each gap 645A, 645B has a width smaller than an outer diameter of ring 640B. Each protrusion 641A, 641B includes a respective inner curved portion 643A, 643B, each of which generally face toward port 625.

In some examples, the inner curved portions 643A, 643B have a radius of curvature generally corresponding to a radius of curvature of an outer surface of ring 640B. In some examples, gap 646 has a width less than an outer diameter of ring 640B, such that ring 640B can releasably engage protrusions 641A, 641B without passing through gap 646, as further described later in association with at least FIG. 14B. Accordingly, in some instances, the inner curved portions 643A, 643B of protrusions 641A, 641B together define a seat 647 against which the ring 640B removable engages when the respective valve is in an open position.

While outlet valve 608 is external to main chamber 604, in some examples the inlet valve 606 is located within main chamber 604 at one end of main chamber 604. As shown in FIG. 13, inlet valve 608 is internal to gap 629 (i.e. inlet 629) and includes a chamber portion 630A, which is at least partially defined by inner curved walls 626A, 626B, protrusions 651A, 651B, and first wall 620B. In some examples, first wall 620B comprises a floor or bottom wall of chamber portion 630A. However, in some examples, first wall 620B comprises a wall of chamber portion 630A other than a floor or bottom wall.

The protrusions 651A, 651B are spaced apart from each other to form a central gap 656 and each protrusion 651A, 651B is spaced apart from a respective one of the curved walls 626A, 626B to form a gap 627A, 627B (FIGS. 13, 14A). Each gap 627A, 627B has a width smaller than an outer diameter of ring 640A. Each protrusion 651A, 651B includes a respective inner curved portion 653A, 653B, each of which generally faces toward port 629.

In some examples, the inner curved portions 653A, 653B have a radius of curvature generally corresponding to a radius of curvature of an outer surface of ring 640A. In some examples, gap 656 has a width less than an outer diameter of ring 640A, such that ring 640A can releasably engage protrusions 641A, 641B without passing through gap 656, as further described later in association with at least FIG. 14A. Accordingly, in some instances, the inner curved portions 653A, 653B of protrusions 651A, 651B together define a seat 657 against which the ring 640A removable engages when the respective valve is in an open position.

In one aspect, the freely movable member (e.g. ring 640A, 640B) is movable in a direction generally parallel with a direction of fluid flow (as represented by arrow FF) through the main chamber 604. In other words, the freely movable member does not generally move in a direction perpendicular to the direction of fluid flow through the main chamber 604.

In some examples, rings 640A, 640B take the form of an annular ring as shown in at least FIGS. 17A-17B. In some examples, each ring 640A, 640B is replaced by a freely movable member have a general disc shape, such as the disc described and shown in association with at least FIGS. 31-32, which does not have a central hole. However, it will be understood that such a disc-shaped member is not necessarily limited to the method of making a pump as described in association with FIGS. 28A-32.

In some examples, instead of having a ring-shape (e.g. 640A, 640B) the freely movable member may have a disc shape (e.g. no central hole).

In some examples, instead of having ring-shaped freely movable member, the respective valves include a freely movable member having a non-ring shape, such as but not limited to a cone shape, spherical shape, etc. In some instances, such shapes are suited for deployment in association with a method of making a pump, as later described in association with at least FIGS. 16-20, in which the shape and/or material of the freely movable member is not generally limited by the materials and/or particular fabrication arrangements to form the valve chambers containing the freely movable member.

In some examples, as further shown in FIGS. 13-14B, the first wall 620B, 620C of the respective chamber portions 630A, 630B in each valve 606, 608 extends in generally the same plane as the first wall 620A of the main chamber 604. In some examples, the first wall 620B, 620C of the respective chamber portions 630A, 630B in each valve 606, 608 extends in exactly the same plane as the first wall 620A of the main chamber 604 because together they define a common wall.

In some examples, each ring 640A, 640B has a height (H2) that is more than one-half the interior height (H3) of the valve chamber portion in which the respective rings 640A, 640B are contained. For illustrative simplicity, one example of this relationship is shown later in association with at least FIG. 18. In one aspect, this arrangement prevents the respective rings 640A, 640B from rotating vertically into a different orientation. In other words, this arrangement ensures that the flat, generally planar sides of the rings 640A, 640B remains generally parallel to the floor 620B, 620C of the respective valve chamber portions 630A, 630B.

In one aspect, by providing the freely movable member as ring-shaped structure (as compared to a solid structure), less energy can be used to move the member back and forth within the valve chamber 630A, 630B, such that a higher frequency response of freely movable member within each respective valve is achieved.

FIG. 15A is a sectional view of pump 600, according to one example of the present disclosure. As shown in FIG. 15A, pump 600 includes the structure shown in FIGS. 13, 14A, 14B and further includes an external force applicator 672 and a membrane 670 covering main chamber 604 and inlet and outlet valves 606, 608. The external force applicator 672 is operable to cause membrane 670 to selectively move (i.e. be deflected) inward or outward relative to main chamber 604 in repeating cycles to produce alternating iterations of suction and expulsion on main chamber 604. In some examples, the suction phase corresponds to an outward stroke (represented by directional arrow A2) of the external force applicator 672 while the expulsion phase corresponds to an inward stroke (represented by directional arrow A1) of the external force applicator 672.

In some examples, the membrane 670 is made of a material which is sufficiently elastic to enable deflections (caused by the external force applicator 672) to move fluid through the pump. In some examples, the membrane 670 is made of a material formed of glass, silicon, or a polymer.

In some examples, instead of being located at a top portion of main chamber 604, membrane 670 defines the floor 620A of a main chamber of the pump 600 with external force applicator 672 located beneath the floor 620A. Other variations are described throughout the present disclosure, such as but not limited to, the examples of FIGS. 15C-15D described below.

More generally speaking, it will be understood that in some examples, any one of the walls (top, bottom, side, etc.) of the main chamber can be at least partially defined by or formed as an at least partially elastic membrane to which a force applicator may be coupled. Accordingly, the function and operation of the chamber is not strictly dependent on a particular location or relative orientation (e.g. top, bottom, side, etc.) of the at least partially elastic membrane relative to other walls defining the chamber.

In some examples, external force applicator 672 is a piezo-electric based actuator, a thermal-resistive based actuator, or a magnetic field-based actuator. In some examples, these types of an external force applicator 672 are suited for deployment in (but not limited to) at least the examples associated with FIGS. 21-26 and FIGS. 28A-32. As noted elsewhere, at least some of these same modalities also may be employed as an internal force applicator to cause fluid actuation of the pump.

In some examples, external force applicator 672 comprises a rocker arm controlled via a solenoid. In some examples, this type of an external force applicator 672 is suited for deployment in (but not limited to) at least the example associated with FIGS. 16-20.

In some examples, as shown in FIG. 14A, in a suction phase free-floating ring 640B of outlet valve 608 is drawn into contact with and generally blocks port 625 while free-floating ring 640A of inlet valve 606 is driven into contact with seat 657 (formed by curved portions 653A, 653B), thereby opening port 629 to receive fluid for flow into and through passages 627A, 627B to enter and fill main chamber 604, as represented via directional arrows F3.

In some examples, as shown in FIG. 14B, in an expulsion phase free-floating ring 640A is driven into contact against and generally blocks port 629 to inhibit intake of fluid into main chamber 604. At the same time, free-floating ring 640B of outlet valve 608 is driven away from port 625 and into contact with seat 647 (formed by curved portions 643A, 643B), thereby permitting fluid to exit main chamber 604 and flow through passages 645A, 645B to exit the pump 600, as represented via directional arrows F4.

Accordingly, with this arrangement, external force applicator 672 acts in repeating cycles to cause suction and expulsion within main chamber 604 (as shown in FIGS. 14A-14B) and thereby move fluid through the pump 600.

In some examples in which the pump 600 serves as the pump 74 in the examples described in association with at least FIG. 1B, pump 600 forces coolant through the circulation loop 80 of a housing 52 of an electronic device 50. In some examples, pump 600 serves as a pump to move other types of fluids, including but not limited to, ink, solvents, etc.

It will be understood that in some examples, blocking of ports 629, 625 via the respective rings 640A, 640B corresponds to significantly obstructing ports 629, 625, but not completely sealing shut those ports 629, 625. In other words, in some examples the presence of rings 640A, 640B across the respective ports 629, 625 achieves at least a differential relative resistance but does not necessarily involve complete sealing that would prevent all fluid flow. However, in some examples, blocking of ports 629, 625 may involve completely sealing to prevent all liquid from flowing therethrough.

In another aspect, the direction of fluid flow (arrow FF) through the pump 600 is generally parallel to a plane through which a longitudinal axis of the membrane 670 extends. In other words, the direction of fluid flow (arrow FF) through the main chamber 604 and the valves 606, 608 is not perpendicular to the membrane 670.

In some examples, the respective rings 640A, 640B are made of materials other than magnetic materials. Accordingly, the rings 640A, 640B are not manipulated via magnetism to achieve different positions within a respective valve 606, 608 to open and close the valves. Rather, different positions of the ring 640A, 640B within the valves 606, 608 are dictated in response to a fluid flow, which in turn is dictated via forces exerted on the fluid (within a chamber) by a force applicator (e.g. 672) coupled to a main chamber 604 associated with the respective valves 606, 608. Accordingly, within the fluid, the rings 640A, 640B each move freely (e.g. are free floating) within each respective valve chamber portion 630A, 630B.

FIG. 15B is a sectional view schematically illustrating a station 680 to which a pump 688 is removably coupled, according to one example of the present disclosure. In some examples, pump 688 includes at least some of substantially the same features and attributes as pump 600 described in association with at least FIGS. 13-15A, except for omitting an external force applicator 672 on the membrane 670 (FIG. 15A). In some such examples, the pump 688 is deployed in an environment other than moving coolant within an electronic device.

As shown in FIG. 15B, in some examples station 680 includes a housing 682 with a slot 684 and an external force applicator 686 positioned to be exposed at slot 684. The slot 684 removably receives at least pump 688 (on substrate 689) to enable removably coupling the external force applicator 686 relative to an at least partially elastic membrane 670 of pump 688. In this way, the pump 688 becomes operable to control fluid flow through a circulating loop, in a manner consistent with the description associated with at least FIGS. 1-12. In some examples, when use of the pump 688 and any associated components is finished, the pump 688 can be discarded as a disposable item. Meanwhile, the station 680 (including external force applicator 686) is retained and available for future use with other pumps, thereby conserving both physical and financial resources. In some examples, such an arrangement is beneficial in medical applications and other environments where sterility is significant.

FIG. 15C is sectional view schematically illustrating at least a portion of a pump 690 on a substrate, such as (but not limited to) printed circuit board 70, according to one example of the present disclosure. In some examples, pump 690 comprises at least some of substantially features and attributes as the pump 600 of FIG. 15A, except for locating the external force applicator 692 underneath the main chamber 604 (instead of on top of membrane 670 as in FIG. 15A) such that the external force applicator 692 is embedded within a portion of the printed circuit board 70. Accordingly, in some such examples, the external force applicator 692 may be embodied at least partially as a thermal resistor on or in the printed circuit board 70. In some examples, the external force applicator 692 is formed generally contemporaneously with, and is generally co-located with, other non-pump-related circuitry formed on or in the printed circuit board 70.

In one aspect, this arrangement avoids a separate later step of affixing an external force applicator on top of a main chamber of a pump after construction of the pump. Moreover, in the example of FIG. 15C, any connecting elements between the external force applicator 692 and the printed circuit board 70 may be formed within or on the printed circuit board 70, thereby avoiding the external presence and routing of connecting elements (e.g. wires) that would otherwise be involved in powering and controlling the external force applicator mounted on top of a pump.

In some examples of this arrangement shown in FIG. 15C, a first wall 620A of the main chamber 604 of the pump 690 is provided with a thickness and of a material suitable to function as a deflectable membrane responsive to the action of the external force applicator 692. Accordingly, in this sense, instead of the element 670 serving as an at least partially elastic membrane as shown and described in FIG. 15A, the layer 694 of the main chamber 604 as shown in FIG. 15C comprises an at least partially elastic membrane, which is deflectable as actuated by the embedded external force applicator 692, to cause suction or expulsion of fluids from the main chamber 604 of the pump 690 in a manner consistent with the previously described pumps in association with at least FIGS. 1-15A.

FIG. 15D is sectional view schematically illustrating at least a portion of a pump 695 on a substrate, such as (but not limited to) a printed circuit board 70, according to one example of the present disclosure. In some examples, pump 695 comprises at least some of substantially features and attributes as the pump 690 of FIG. 15C, except for locating a force applicator 696 to define the first wall 620A of the main chamber 604 such that the force applicator 692 is exposed to an interior of the main chamber 604. Accordingly, in some instances, the force applicator 692 may be referred to as an internal force applicator. In some examples, the force applicator 696 is embedded within a portion of the printed circuit board 70. In some examples, the force applicator comprises a thermal resistive-based actuator embedded with a silicon wafer substrate 70. In some examples, additional electronic elements (e.g. transistors, diodes, etc.) are also embedded within some portion of the silicon wafer substrate 70.

Accordingly, in some examples, this arrangement described in association with FIG. 15D may be employed in at least some of the examples later described in association with FIGS. 21-32 in which the internal force applicator 696 is employed instead of an external force applicator (e.g. 845 in FIG. 26) with the internal force applicator 696 embedded (or otherwise provided) within an upper portion of a base structure (e.g. 902 in FIGS. 28A-30 or 806 in FIGS. 21-26).

FIGS. 16-18 are each a sectional view schematically illustrating a valve during a method of making a pump, according to one example of the present disclosure. In these Figures, cross-hatching is omitted for illustrative clarity. In some examples, the pump constructed according to this method may be employed as one of the pumps 74, 94, 174, 274, 284, 354A-354C, 600, 688, 690, as previously described in association with at least FIGS. 1-15C. In some examples, the pump constructed according to the method described in association with FIGS. 16-18 is used in arrangements other than those previously described in association with at least FIGS. 1-15C.

In some examples, the sectional view in FIGS. 16-18 generally corresponds to a sectional view like the view taken along lines 16-16 in FIG. 13 of a valve 608, except with FIGS. 16-18 representing intermediate stages of construction of the valve assembly in FIG. 13, whereas FIG. 13 represents a completed construction of valve 608 (except for the covering membrane removed for illustrative purposes).

As shown in FIG. 16, in some examples a method of constructing a pump begins with molding, as a single piece, a main chamber, an inlet valve chamber, and an outlet valve chamber. The outlet valve chamber is at an opposite end of the main chamber from the inlet valve chamber. As previously shown in FIG. 13, the main chamber and respective valve chamber portions of the pump being formed in FIGS. 16-18 extend in at least generally same plane. In some instances, they extend in exactly the same plane via a common first wall like the first wall 620A, 620B, 620C of pump 600 in FIGS. 13-14B, with the common wall being identified as 712 in FIG. 16. In some examples, the molding of the pump includes injection molding and the material used includes epoxy moldable compound (EMC). In some examples, the material is non-ceramic material. In some examples, the material is a biocompatible material, such as but not limited to, glass.

In one aspect, formation of the main chamber, inlet valve chamber, and outlet valve chamber of the pump occurs without drilling.

FIG. 16 shows one sectional view of this molded, single piece 702 as having a first surface 704A and opposite second surface 704B, and opposite outer surfaces 706A, 706B. A chamber 710 of a valve (e.g. valves 606, 608 in FIGS. 13-14B) is defined by inner surfaces 711A, 711B (of respective walls 714A, 714B) and wall 712. In some examples, wall 712 defines a floor or bottom wall. In some examples, wall 712 defines a wall other than a floor or bottom wall.

In some examples, as shown in FIG. 17A, a freely movable member 730 is placed into chamber 710 of molded portion 702. As shown in FIG. 17A-17B, in some examples, the freely movable member 730 is a ring structure including an inner wall 734 and an outer wall 732, as well as a first surface 736 and second surface 738. With further reference to FIG. 17A, it will be understood that freely movable member 730 does not have a fixed position relative to surfaces 711A, 711B and wall 712 of molded portion 702, but rather FIG. 17A illustrates a size and shape of freely movable member 730 within a valve chamber portion 710 of a pump. Moreover, it will be understood that once fully constructed, the freely movable member 730 will be movable within valve chamber portion 710 upon movement of dielectric coolant within and/or through the valve chamber portion 710, which contains member 730 in a manner consistent previously described in association with at least FIGS. 13-15A.

In some examples, the freely movable member 730 is made of a material different than the single molded piece 720 (which defines the main chamber and respective valve chamber portions). In some examples, the freely movable member 730 is formed of a graphite material or other material having lubricous qualities.

In some examples, the freely movable member 730 is made from a material such that a position of the freely movable member 730 is not controllable via a force external to the respective inlet and outlet valves of the pump. Accordingly, in some examples, the freely movable member 730 is made of a non-magnetic material.

With this in mind, FIG. 18 is a sectional view schematically illustrating a valve assembly including the addition of a membrane 750 sealingly secured onto surface 704A of the molded portion 702 to further define valve chamber portion 710, which contains freely movable member 730. In some examples, membrane 750 is made of an at least partially elastic material.

As shown in FIG. 18, the ring 730 is sized with a height (H2) relative to a height (H3) of valve chamber portion 710 to allow gaps S1, S2 above and below freely movable member 730. It will be further understood that because member 730 is freely movable within the valve chamber portion 710, the gaps S1, S2 are not fixed in size and shape but rather represent a temporary state within the valve chamber portion 710.

Via these arrangements, one can provide for a free-floating member as part of valve (e.g. valves 606, 608) of a pump, such as pump 600 in FIGS. 13-15A.

Figure 19B:
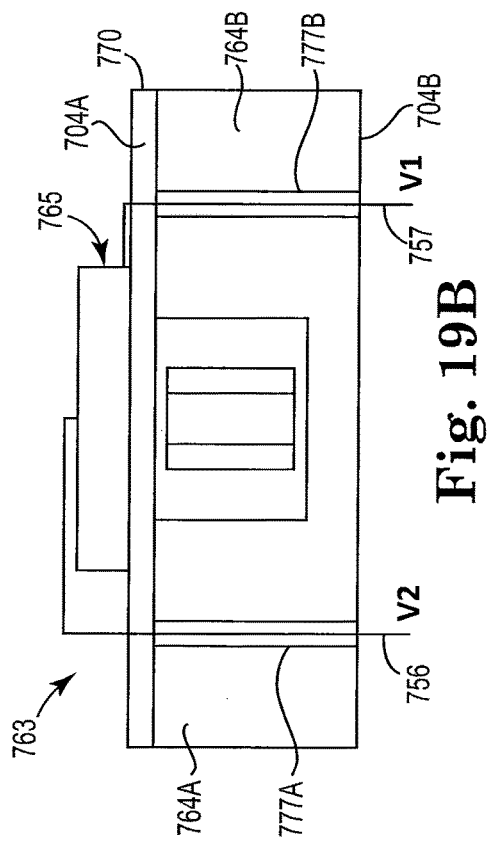
Figure 19A:
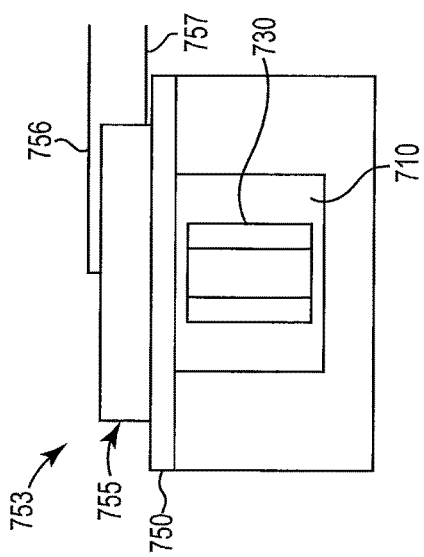

FIGS. 19A-19B are each a sectional view schematically illustrating a portion of a valve of a pump following the construction of the pump shown in FIGS. 16-18, according to one example of the present disclosure. As shown in FIG. 19A, a pump 753 includes an external force applicator 755 coupled to the membrane 750 to enable application of external forces to cause cyclical deflections of membrane 750 in opposite directions to produce suction and expulsion actions within a main chamber (e.g. 604 in FIGS. 13-15A) of the pump, in a manner consistent with such operation as previously described and illustrated in association with at least FIGS. 13-15A. As further shown in FIG. 19A, wires 756, 757 are provided for powering and controlling operation of the external force applicator 755 and generally extend laterally and above the pump 753.

FIG. 19B depicts a pump 763 having substantially the same features and attributes as the pump 753 of FIG. 19A, except for providing alternate routing for wires 756, 757, according to one example of the present disclosure. In particular, as shown in FIG. 19B, walls 714A, 714B of pump 753 are replaced with walls 764A, 764B for pump 763 and a membrane 770 having apertures 777A, 777B extending from the top surface 704A to the bottom surface 704B of pump 763. Each aperture 777A, 777B is sized and shaped to house one of the respective wires 756, 757 to route wires 756, 757 from external force applicator 755 above membrane 750 to surface 704B to facilitate connection of wires 756, 757 to a printed circuit board (e.g. PCB 70 in FIG. 1). In one aspect, routing the wires in this manner provides a more compact and lower profile arrangement on a surface of a printed circuit board 70 or other substrate.

In some examples, a pump such as (but not solely limited to) pump 600 shown in FIGS. 13-14B is formed by pressing or embossing instead of molding.

Figure 20:
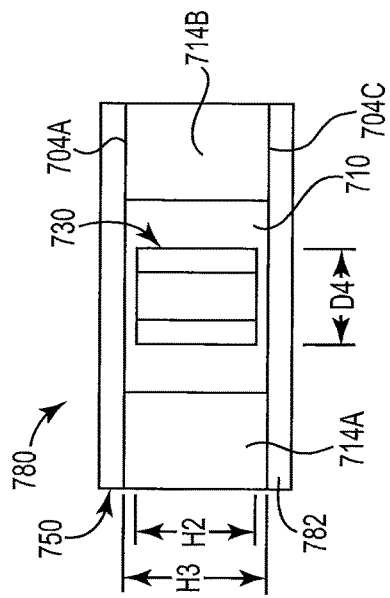
FIG. 20 is a sectional view like that taken along lines 16-16 of FIG. 13 and schematically illustrating a portion of a valve during a method of making a pump, according to one example of the present disclosure.

FIG. 20 is a sectional view schematically illustrating a valve assembly 780 having at least substantially the same features and attributes as the valve assembly 740 of FIG. 18, except further including an opposite second membrane 782 sealingly secured to the surface 704C of molded walls 714A, 714B to define valve chamber portion 710, which contains freely movable member 730. A partial chamber is formed by molding or otherwise providing side walls 714A, 714B and then attaching at least partially elastic membranes on opposite surfaces of the partial chamber, respectively, of the partial main chamber structure. With this arrangement, both at least partially elastic membranes 750, 782 cooperate to create the previously described fluid actuation. In some examples, a pump is made through a subtractive process in which a molded block of material is provided and then a removal technique (e.g., drilling, machining, computer controller cutting (CNC), etc.) is applied to form the requisite valve chambers and main chamber. In such an arrangement, after a main chamber and valve chamber is defined via such removal techniques, a freely moveable part (e.g., a ring 640A, disc, cone, spherical member, etc.) is placed within the defined valve chamber.

Accordingly, formation of the main chamber and valve chambers performed via the examples and variations described in association with FIGS. 16-20 may occur independent of the formation of the freely movable member such that a greater range of materials, shapes, and formation methods may be employed to produce the freely movable member, as noted above.

While different methods are described later in association with FIGS. 21-32 regarding formation of a separable structure within a valve chamber, in each of those methods, the resulting configuration results in a separable structure having the general operational characteristics as described and illustrated in association with FIGS. 13-15A. With this in mind, in some examples, the separable structure is made from a material such that a position of the separable structure (e.g. a freely movable member) is not controllable via a force external to the respective inlet and outlet valves of the pump. Accordingly, in some examples, the formed separable structure in the example methods (in association with FIGS. 21-26 and FIGS. 28A-32) is made of a non-magnetic material.

In some examples, the pumps constructed via the methods described in association with FIGS. 21-26 and FIGS. 28A-32 have openings and pathways on the order of less than 100 microns and provide chambers and valve chambers having a depth of less than 1 millimeter. Accordingly, in some instances, such pumps are referred to as micropumps and are employable in microfluidic applications. In some instances, these micropumps are deployed on a scale commensurate with thermal inkjet modalities, and therefore may be formed contemporaneously with, and may be co-located with, components, modules, etc. of thermal inkjet structures and thermal inkjet-related structures. One example arrangement in which such pumps may be deployed is described later in association with at least FIGS. 33-34.

FIGS. 21-26 are each a sectional view schematically illustrating a portion of a valve during a method of making a pump, according to one example of the present disclosure.

In some examples, the pump constructed according to this method may be employed as one of the pumps 74, 94, 174, 274, 284, 354A-354C, 600, 680, 688, as previously described in association with at least FIGS. 1-15D. In some examples, the pump constructed according to the method described in association with FIGS. 21-26 is used in arrangements other than those previously described in association with at least FIGS. 1-15D.

FIG. 21 is a sectional view schematically illustrating a base structure 800 from which a pump (including a valve like valves 606, 608 in FIGS. 13-14B) is constructed, according to one example of the present disclosure. As shown in FIG. 21, base structure 800 includes a first layer 802, an intermediate layer 804, and a second layer 806, with base structure 800 defining a first surface 803A, second surface 803B, and opposite sides 805A, 805B. In some examples, the base structure 800 includes a silicon-on-oxide structure and the intermediate layer 804 comprises an oxide layer with the other layers comprising silicon.

However, in some examples, the base structure 800 includes any silicon wafer including a buried intermediate layer 804 (e.g. sacrificial layer). In some examples, the intermediate layer 804 is a non-silicon material. For instance, base structure 800 may be formed via sandwiching an epoxy layer between two separate silicon wafers to provide a single, bonded layered structure with the epoxy layer serving as the intermediate layer 804 (e.g. a sacrificial layer).

FIG. 22 schematically illustrates the removal of a portion of first layer 802 to form a ring-shaped structure 811A, as further shown in at least the top view of FIG. 23B. In some instances, ring structure 811A is referred to as a separable structure because the ring structure 811A will later become separated from the other portions of the chamber portion 813. As shown in FIG. 22, this removal results in a chamber portion 813 with ring wall portions 810A, 810B extending upward from a first floor portion 814 and spaced laterally from side walls 815 of chamber portion 813. In some examples, such formation is performed via photolithography and anisotropic dry etching.

In some examples, the separable structure 811A is provided via a disc-shaped member (i.e. no central hole) instead of a ring-shaped structure.

In some examples, the separable structure 811A is formed of the same material as the main chamber (e.g. 604 in FIGS. 13-14B) and the valve chamber portion 813 (or 630A, 630B in FIGS. 13-14B) of a pump.

As shown in FIG. 23A, this method further includes removal of an upper portion of the ring wall portions 810A, 810B (in FIG. 22) to produce shorter ring wall portions 820A, 820B and removal of a portion of first layer 802 to result in at least partial formation of corresponding portions of main chamber (e.g. 604 in FIGS. 13-14B), and valve chamber portion 813 (e.g. or 630A, 630B in FIGS. 13-14B). In some examples, such formation is performed via anisotropic dry etching.

Figure 24:
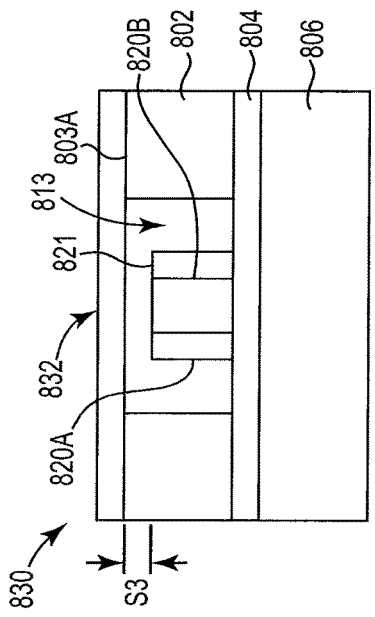

FIG. 24 schematically illustrates the addition of a membrane 832 onto surface 803A of first layer 802 and above ring wall portions 820A, 820B, thereby resulting in spacing (S3) between the membrane 832 and a surface 821 of ring wall portions 820A, 820B. This addition of membrane 832 also enables containment of a dielectric coolant or other fluid, which may selectively flow through the pump after its construction is completed.

Figure 25:
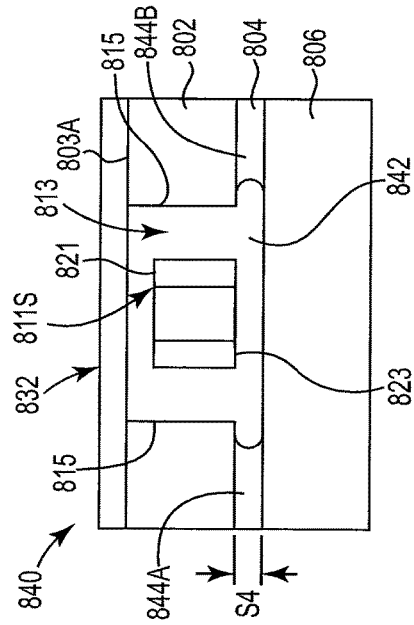

FIG. 25 schematically illustrates removal of a portion of intermediate layer 804 to yield a gap 842 between remaining outer portions 844A, 844B of intermediate layer 804. In some examples, the gap 842 has a width at least as great as the width of the valve chamber 813. Removal of the portion of intermediate layer 804 below ring structure 811A produces a gap (represented by spacing S4) below a bottom portion 823 of ring structure 811A to thereby free ring structure 811A from the base structure 800, yielding a ring structure 811S that is able to move freely within valve chamber portion 813. Accordingly, in some instances, this free-floating ring structure 811S is referred to as a freely movable member. In one aspect, the freely movable ring structure 811S is made of the same material forming the valve chamber 813 (and/or main chamber) which contains the ring structure 811. In some examples, removal of the portion of the intermediate layer 804 is performed via buffered oxide etching (BOE).

In some instances, the intermediate layer 804 is referred to as a sacrificial element because it is formed and then a portion of it is later sacrificed (i.e. removed) to form the freely movable ring structure 811S.

In some examples, the removal of at least a portion of intermediate layer 804 also results in at least partial formation of corresponding portions of central chamber (e.g. main chamber 604 in FIGS. 13-14B), valve chambers 606, 608 to define a first wall (e.g. 620A-620C in FIGS. 13-14B) of those respective structures.

Figure 26:
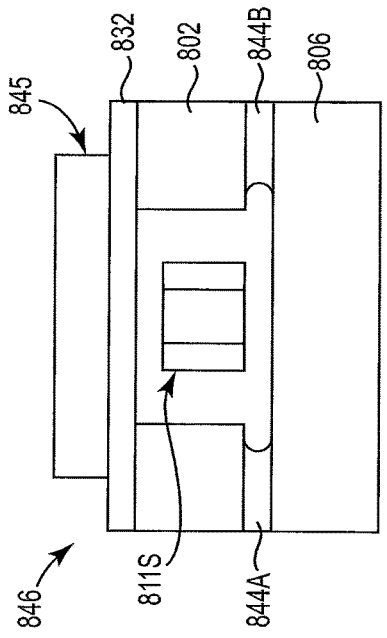

FIG. 26 is a sectional view schematically illustrating a pump, including a valve, during a method of making the pump, according to one example of the present disclosure. As shown in FIG. 26, pump 846 includes the addition of an external force applicator 845 on membrane 832 to enable causing deflections of membrane 832 relative to a main chamber (e.g. 604 in FIGS. 13-15A) to cause intake and expulsions of fluid, in a manner consistent with the operations previously described in association with at least FIGS. 13-15A. As mentioned elsewhere, in some examples other forms of force application such as those described in association with at least FIGS. 15B-15D may be employed.

Accordingly, in some instances, the method described in association with FIGS. 21-26 is considered a subtractive process in which material is a portion of material is provided and then portions strategically removed to produce a pump including a main chamber, valve chambers, and a freely movable portion for containment within the valve chambers.

Figure 27:
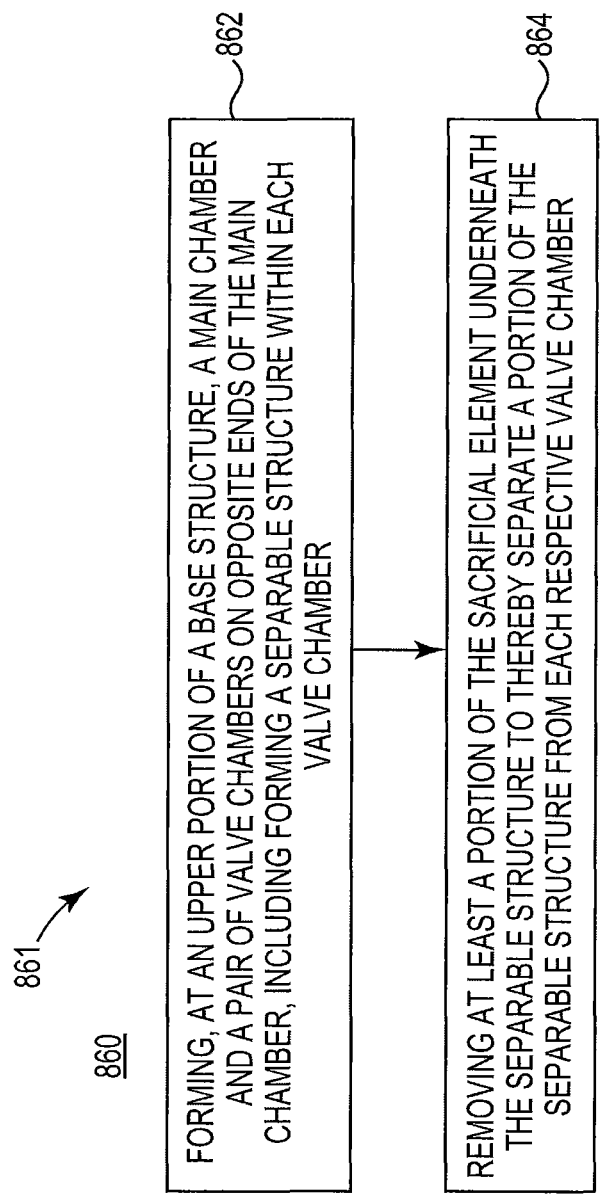
FIG. 27 is a flow diagram schematically illustrating a method of making a pump, according to one example of the present disclosure.

FIG. 27 is a flow diagram 860 of a method 861 of forming a pump, according to one example of the present disclosure. In some examples, method 861 is performed according to the methods and components previously described in association with at least FIGS. 21-26.

As shown in FIG. 27, method 861 includes forming, at an upper portion of a base structure, a main chamber and a pair of valve chambers on opposite ends of the main chamber, including forming a separable structure within each valve chamber.

At 864, method 861 includes removing at least a portion of a sacrificial element to thereby separate a bottom portion of the separable structure from a floor of each respective valve chamber.

In some examples, method 861 is also applicable to the method of making a pump as described in association with at least FIGS. 28A-32.

FIGS. 28A-32 are each sectional views schematically illustrating a portion of a valve during a method of making a pump, according to one example of the present disclosure. For illustrative clarity, cross-hatching has been omitted. In some examples, the pump constructed according to this method is employed as one of the pumps 74, 94, 174, 274, 284, 354A-354C, 600, 680, 690, as previously described in association with at least FIGS. 1-15D. In some examples, the pump constructed according to the method described in association with FIGS. 27-32 is used in arrangements other than those previously described in association with at least FIGS. 1-15D.

As shown in FIG. 28A, method 900 includes providing a base component 902 having a surface 903, on which a sacrificial element 904 is formed. In some examples, base component 902 is made of a material comprising glass, silicon, ceramic, metal, or polymer.

As shown in FIG. 28B, a pair of first wall components 912A, 912B is formed onto surface 903 of base component 902. The sacrificial element 904 is interposed therebetween and spaced apart (by a distance S5) from the respective wall components 912A, 912B. FIG. 28B also depicts a thickness or height (H4) of first sacrificial element 904, which is less than a thickness or height (H5) of first wall components 912A, 912B.

In some examples, components of the pump other than base component 902 are made from an epoxy-based negative photoresist material, such as (but not limited to) SU-8 sold by MicroChem Corporation of Westborough, Mass. In some examples, base component 920 also may be made of the negative photoresist material.

In some examples, the first layer 902 comprises a substrate, which includes embedded resistors and CMOS circuitry, so that a pump (including the main chamber and valve chambers) is formed on same platform as thermal inkjet (TIJ) structures and in some examples, may be formed contemporaneously with or collaboratively with thermal inkjet structures and/or thermal inkjet-related structures.

In some examples, the sacrificial element includes a metal material or a dialectic layer, such as chemical vapor deposition (CVD) oxide. In some examples, the sacrificial element includes a semiconductor material, such as polysilicon deposited via chemical vapor deposition (CVD) or physical vapor deposition (PVD).

As shown in FIG. 29, a pair of second wall components 922A, 922B is formed on top of the first wall components 912A, 912B, respectively, and a separable structure 914 is formed on top of sacrificial element 904. In some examples, the separable structure 914 is formed contemporaneously with second wall components 922A, 922B. In some examples, such contemporaneous formation includes forming a single layer of material at specific, targeted locations, which results in simultaneous formation of the separable structure 914 and second walls components 922A, 922B. In one aspect, separable structure 914 has a thickness or height (H6), which is generally equal to a thickness or height of the second wall components 922A, 922B.

As shown in FIG. 30, a membrane 942 is added or formed on top of the second wall elements 922A, 922B to at least partially define chamber portion 945, with a gap (G1) being formed between the separable structure 914 and membrane 942. FIG. 31 shows a top view of structure 914, revealing a generally disc-shaped member.

As shown in FIG. 32, sacrificial element 904 is removed, thereby separating separable structure 914 from a surface 947 of base component 902, which also acts as one wall of chamber portion 945. Upon such separation, a gap (S6) is introduced below separable structure 914. In one aspect, in the arrangement of FIG. 32, separable structure 914 is free-floating within chamber portion 945 such that structure 914 is free to move about within chamber portion 945 in the presence of fluid in a manner consistent with the operations of inlet and outlet valves 606, 608, as previously described and illustrated in association with at least FIGS. 13-15D.

In some examples, separable structure 914 takes the form of a generally disc-shaped member (FIG. 31) or a ring-shaped member, but in some examples, separable structure 914 may take other shapes.

In some examples, prior to adding membrane 942, an additional sacrificial layer is formed within the chamber portion 495 and on top of the separable structure 914 to ensure that separable structure 914 does not become secured to the membrane 942. The additional sacrificial layer may be then later removed when the sacrificial element 904 is removed, such that separable structure 914 becomes freely movable within the formed valve chamber as described above.

Accordingly, with regard to the examples of FIGS. 21-26 and/or FIGS. 28A-32, a freely movable member is formed from at least some of the same material used to form the valve chamber in which the freely movable member is contained.

As in various examples previously described herein, a force applicator such as those described in association with at least FIGS. 15A-15D may be employed with the valve and pump structure formed via the method described in association with FIGS. 28A-32.

Accordingly, in some instances, the method described in association with FIGS. 28A-32 is generally considered an additive process in which a base structure is provided and then portions strategically added to a pump including a main chamber, valve chambers, and a freely movable portion for containment within the valve chambers. However, like the method described in association with FIGS. 21-26, the method of FIGS. 28A-32 includes removal of a sacrificial element to separate the freely movable member from other structures during formation of the pump.

Figure 33:
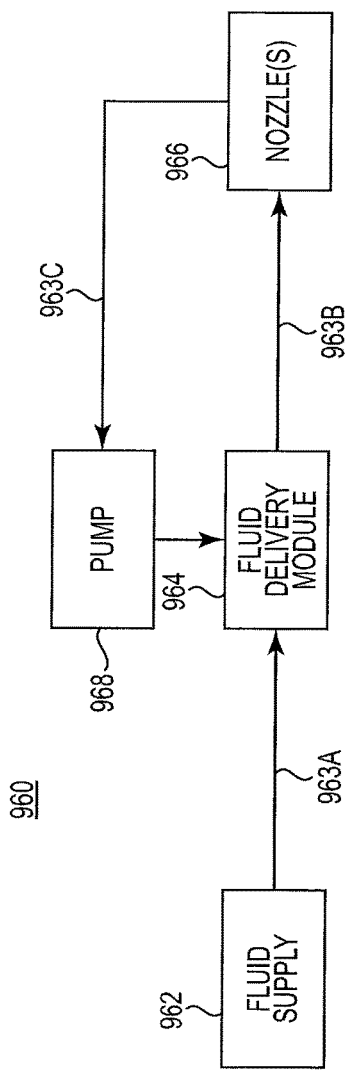
FIGS. 33-34 are each a block diagram schematically illustrating a fluid ejection system, according to one example of the present disclosure.
Figure 34:
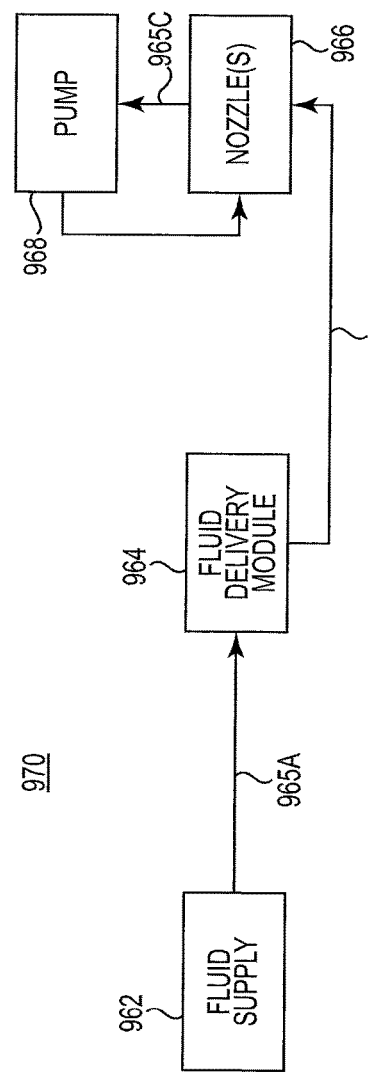

FIGS. 33-34 are each block diagrams schematically illustrating a fluid ejection system, according to one example of the present disclosure. In some examples, the fluid ejection system may be an ink ejection system, such as in a printing system. It will be further understood that such printing systems may eject fluids other than ink. In some examples, the fluid ejection system is a thermal inkjet (TIJ) system.

As shown in FIG. 33, system 960 includes a fluid supply 962, a fluid delivery module 964, nozzle(s) 966, and a pump 968. Via pathway 963A, fluid supply 962 supplies fluid to an input of the fluid delivery module 964 and an output of fluid delivery module 964 delivers fluid in a controlled manner (via pathway 963B) to an input of nozzle(s) 966 of a printhead. Via a surplus fluid output, nozzle(s) 966 return surplus fluid via pathway 963C to a pump 968, which directs the surplus fluid to a surplus input of fluid delivery module 964. In this way, surplus fluid not used in printing from nozzle(s) 966 is indirectly re-circulated to the nozzle(s) 966 of a printhead.

As shown in FIG. 34, system 970 includes generally the same components as system 960 of FIG. 33, except with providing a different arrangement of pathways among the components of the fluid supply 962, fluid delivery module 964, nozzle(s) 966, and pump 968. Via pathway 965A, fluid supply 962 supplies fluid to an input of the fluid delivery module 964 and an output of the fluid delivery module 964 delivers fluid in a controlled manner (via pathway 965B) to nozzle(s) 966 of a printhead for printing via a print output. However, via a surplus output, nozzle(s) 966 return surplus fluid via pathway 965C to pump 968, which re-directs the surplus fluid directly back into input of nozzle(s) 966.

In one aspect, the systems 960, 970 conserve resources by re-using surplus fluids. In some examples, the pump 968 in systems 960, 970 is constructed according to at least some of the methods and/or components, as previously described herein in association with FIGS. 1-32.

At least some examples of the present disclosure provide for a fluid containment system within an electronic device to pump circulating fluid to cool heat-generating electronic components within the electronic device. At least some examples of the present disclosure provide pumps for use in such fluid containment systems, or other systems such as fluid ejection systems.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

The invention claimed is:

1. A method of making a micropump, comprising:
   forming, at an upper portion of a base structure, a main chamber and a pair of valve chambers on opposite ends of the main chamber, including forming a separable structure within each valve chamber; and
   removing at least a portion of a sacrificial element underneath the separable structure to thereby separate a bottom portion of each respective separable structure from a portion of each respective valve chamber to free the respective separable structure for movement within and relative to each respective valve chamber.

2. The method of claim 1, wherein forming the separable structure within each valve chamber comprises:
   forming the sacrificial element on the upper portion of the base structure;
   forming the separable structure on top of the sacrificial element.

3. The method of claim 2, comprising:
   forming a first portion of a wall portion of the main chamber and of the respective valve chambers; and
   contemporaneously with forming the separable structure, forming a second portion of the wall portion of the main chamber and the respective valve chambers,
   wherein forming the sacrificial element comprises forming the sacrificial element to have a thickness less than a thickness of the first portion of the respective wall portions,
   wherein forming the separable structure comprises forming the separable structure to have a thickness generally equal to a thickness of the second portion of the respective wall portions.

4. The method of claim 1, comprising:
   prior to the removing the at least a portion of the sacrificial element,
   removing a top layer of the separable structure and removing a layer of the respective valve chambers and the main chamber, thereby exposing at least a sacrificial element below the separable structure.

5. The method of claim 4, comprising:
   providing the base structure as a silicon assembly in which a non-silicon intermediate layer is sandwiched between two layers of silicon; and
   arranging at least a portion of the non-silicon intermediate layer as the first sacrificial element.

6. The method of claim 5, comprising:
   forming the pump as part of a substrate, and wherein at least a portion of the substrate includes the silicon assembly.

7. The method of claim 1, comprising:
   prior to removing at least a portion of the first sacrificial element, adding an at least partially elastic membrane to define at least one wall of the main chamber and to define at least one wall of the valve chambers to contain the separable structure; and
   coupling a force applicator to the at least partially elastic membrane.

8. The method of claim 1, wherein the pair of valve chambers includes:
   an inlet valve chamber at a first end of the main chamber; and
   an outlet valve chamber at an opposite second end of the main chamber and external to the main chamber,
   wherein a common wall of the main chamber and the valve chambers extends in generally the same plane.

9. A micropump comprising:
   a main chamber;
   a pair of valves on opposite ends of the main chamber including:
      an inlet valve; and
      an outlet valve external to the chamber,
      wherein the respective inlet valve and outlet valve each contain a freely movable member to selectively open and close each respective valve, wherein the freely movable member is formed from at least some of the same material used to form a chamber portion of the respective valves; and
   a force applicator coupled relative to the main chamber to alternately induce in the main chamber:
      a suction action in which the inlet valve is open and the outlet valve is closed; and
      an expulsion action in which the inlet valve is closed and the outlet valve is open.

10. The pump of claim 9, wherein the force applicator is located at least one of:
   external to, and coupled to, an at least partially elastic membrane defining at least one wall of the main chamber;

within a substrate external to the main chamber and coupled relative to an at least partially elastic membrane defining at least one wall of the main chamber; and within a substrate and defining at least a portion of a first wall of the main chamber exposed to an interior of the main chamber.

11. The pump of claim 9, wherein the freely movable member is movable in a direction generally parallel with a direction of fluid flow through the main chamber.

12. The pump of claim 9, wherein the pump is located within an electronics device comprising:
   a housing enclosure at least sealingly containing:
      a printed circuit board carrying a plurality of spaced apart heat generating members;
      a barrier to define a circulation loop in which coolant is exposed to each respective heat generating member; and
      the pump positioned within the circulation loop to cause flow of the coolant through the circulation loop,
      wherein the pump and the barrier form a monolithic structure as a protruding portion of the printed circuit board.

13. A pump comprising:
   a main chamber;
   a pair of valves on opposite ends of the main chamber including:
      an inlet valve positioned within a first end of the main chamber; and
      an outlet valve external to the chamber,
      wherein the respective inlet valve and outlet valve each contain a freely movable member to selectively open and close each respective valve, and
      wherein the inlet valve, the outlet valve, and the main chamber extend in generally the same plane to guide fluid flow through the pump and movement of the freely movable member in the same plane;
   an at least partially elastic membrane defining at least one wall of the main chamber; and
   a force applicator coupled relative to the at least partially elastic membrane to alternately induce in the main chamber:
      a suction action in which the inlet valve is open and the outlet valve is closed; and
      an expulsion action in which the inlet valve is closed and the outlet valve is open.

14. The pump of claim 9, wherein the freely movable member is made from a material such that a position of the freely movable member is not controllable via a force external to the respective inlet and outlet valves.

15. The pump of claim 13, comprising at least one of:
   a first printing system including:
      at least one nozzle of a printhead, including at least an input and a surplus output;
      a fluid delivery module to receive fluid at a first input from a fluid supply and to deliver fluid via an output to the input at least nozzle, the fluid delivery module including a second input; and
      the pump to receive surplus fluid from the surplus outlet of the at least one nozzle and to deliver the surplus fluid to the second input of the fluid delivery module; and
   a second printing system including:
      at least one nozzle of a printhead, including an input, a print output, and a surplus output;
      a fluid delivery module to receive fluid from a fluid supply and to deliver fluid to the input of the at least one nozzle; and
      the pump to receive surplus fluid from the surplus outlet of the at least one nozzle and to deliver the surplus fluid directly to the input at least one nozzle.

\* \* \* \* \*

UNITED STATES PATENT AND TRADEMARK OFFICE
CERTIFICATE OF CORRECTION

PATENT NO. : 10,100,822 B2  
APPLICATION NO. : 15/546992  
DATED : October 16, 2018  
INVENTOR(S) : Kianoush Naeli et al.

Page 1 of 1

It is certified that error appears in the above-identified patent and that said Letters Patent is hereby corrected as shown below:

On the Title Page

In Column 1, item (71), Applicant, Line 2, after "Company," insert -- L.P., --.

Signed and Sealed this  
Twenty-sixth Day of March, 2019

Andrei Iancu  
*Director of the United States Patent and Trademark Office*